(12) United States Patent
Duquette et al.

(10) Patent No.: US 7,239,399 B2
(45) Date of Patent: Jul. 3, 2007

(54) PICK AND PLACE MACHINE WITH COMPONENT PLACEMENT INSPECTION

(75) Inventors: David W. Duquette, Minneapolis, MN (US); Paul R. Haugen, Bloomington, MN (US); David Fishbaine, Minnetonka, MN (US); John D. Gaida, Victoria, MN (US); David D. Madsen, Lakeland, MN (US); Theodore Paul Dale, Minneapolis, MN (US); Todd D. Liberty, Apple Valley, MN (US); Brant O. Buchika, Minnetonka, MN (US); Scott D. Roth, Newburyport, MA (US); Thomas W. Bushman, Marblehead, MA (US)

(73) Assignee: CyberOptics Corporation, Golden Valley, MN (US)

( * ) Notice: Subject to any disclaimer, the term of this patent is extended or adjusted under 35 U.S.C. 154(b) by 696 days.

(21) Appl. No.: 10/291,074

(22) Filed: Nov. 8, 2002

(65) Prior Publication Data

US 2003/0110610 A1   Jun. 19, 2003

Related U.S. Application Data

(60) Provisional application No. 60/374,964, filed on Apr. 22, 2002, provisional application No. 60/356,801, filed on Feb. 13, 2002, provisional application No. 60/338,233, filed on Nov. 13, 2001.

(51) Int. Cl.
*G01B 11/14* (2006.01)

(52) U.S. Cl. .................... 356/614; 356/400
(58) Field of Classification Search ........ 356/399, 356/400, 611, 614, 615, 237.1; 29/740
See application file for complete search history.

(56) References Cited

U.S. PATENT DOCUMENTS

| 3,814,845 | A |   | 6/1974 | Hurlbrink, III et al. ...... 178/6.8 |
| 4,281,342 | A | * | 7/1981 | Ueda et al. ................. 356/399 |

(Continued)

FOREIGN PATENT DOCUMENTS

EP    0 664 666 B1    8/1997

(Continued)

OTHER PUBLICATIONS

Chinese Office Action from Application No. 02826679.X, filed Nov. 12, 2002.
International Search Report and Written Opinion from application No. PCT/US05/017425, filed May 18, 2005; Copy of Notification of Transmittal of the International Preliminary Report from application No. PCT/US05/017425, filed May 18, 2005.

(Continued)

*Primary Examiner*—Richard A. Rosenberger
(74) *Attorney, Agent, or Firm*—Westman, Champlin & Kelly, P.A.

(57) ABSTRACT

Improved component placement inspection and verification is performed by a pick and place machine. Improvements include stereovision imaging of the intended placement location; enhanced illumination to facilitate the provision of relatively high-power illumination in the restricted space near the placement nozzle(s); optics to allow image acquisition device to view the placement location from an angle relative to a plane of the placement location, thereby reducing the possibility of such images being obstructed by the component; techniques for rapidly acquiring images with commercially available CCD arrays such that acquisition of before and after images does not substantially impact system throughput; and image processing techniques to provide component inspection and verification information.

11 Claims, 25 Drawing Sheets

U.S. PATENT DOCUMENTS

| | | | |
|---|---|---|---|
| 4,825,091 A * | 4/1989 | Breyer et al. ............... 356/3.04 |
| 4,914,513 A | 4/1990 | Spigarelli et al. ............ 358/101 |
| 4,978,224 A | 12/1990 | Kishimoto et al. .......... 356/394 |
| 4,989,082 A | 1/1991 | Hopkins ....................... 358/101 |
| 4,999,785 A | 3/1991 | Schmuter ..................... 364/507 |
| 5,003,692 A | 4/1991 | Izumi et al. ................... 29/834 |
| 5,023,916 A | 6/1991 | Breu ............................... 382/8 |
| 5,105,149 A | 4/1992 | Tokura ......................... 324/158 |
| 5,134,665 A | 7/1992 | Jyoko ............................. 382/8 |
| 5,194,791 A * | 3/1993 | Cull ............................. 356/615 |
| 5,237,622 A | 8/1993 | Howell ........................... 382/8 |
| 5,249,349 A | 10/1993 | Kuinose et al. ............... 29/721 |
| 5,298,977 A | 3/1994 | Shintani et al. .............. 356/394 |
| 5,336,935 A | 8/1994 | Shitanda et al. .............. 307/116 |
| 5,377,405 A | 1/1995 | Sakurai et al. ................. 29/833 |
| 5,383,270 A | 1/1995 | Iwatsuka et al. .............. 29/840 |
| 5,384,956 A | 1/1995 | Sakurai et al. ................. 29/834 |
| 5,392,360 A | 2/1995 | Weindelmayer et al. ........ 382/8 |
| 5,461,480 A | 10/1995 | Yamada et al. .............. 256/394 |
| 5,467,186 A | 11/1995 | Indo et al. .................... 356/150 |
| 5,471,310 A * | 11/1995 | Spigarelli et al. ............ 356/399 |
| 5,495,424 A | 2/1996 | Tokura ......................... 364/507 |
| 5,541,834 A | 7/1996 | Tomigashi et al. ..... 364/167.01 |
| 5,550,583 A | 8/1996 | Amir et al. ................... 348/126 |
| 5,566,447 A | 10/1996 | Sakurai ........................ 294/832 |
| 5,589,942 A * | 12/1996 | Gordon ........................ 356/611 |
| 5,598,345 A | 1/1997 | Tokura ......................... 364/489 |
| 5,619,328 A | 4/1997 | Sakurai ........................ 356/375 |
| 5,627,913 A | 5/1997 | Spigarelli et al. ............ 382/151 |
| 5,660,519 A | 8/1997 | Ohta et al. ................... 414/783 |
| 5,686,994 A | 11/1997 | Tokura ......................... 356/394 |
| 5,719,952 A | 2/1998 | Rooks .......................... 382/150 |
| 5,724,722 A | 3/1998 | Hashimoto ................... 29/740 |
| 5,739,846 A | 4/1998 | Gieskes ......................... 348/87 |
| 5,745,241 A | 4/1998 | Hashimoto ................... 356/384 |
| 5,749,142 A | 5/1998 | Hanamura .................... 29/833 |
| 5,754,677 A | 5/1998 | Kawada ....................... 382/141 |
| 5,835,133 A * | 11/1998 | Moreton et al. .............. 348/49 |
| 5,839,186 A | 11/1998 | Onodera ....................... 29/720 |
| 5,900,940 A | 5/1999 | Aoshima ...................... 356/375 |
| 5,908,282 A | 6/1999 | Onodea ....................... 414/783 |
| 5,912,984 A | 6/1999 | Michael et al. .............. 382/149 |
| 5,956,149 A | 9/1999 | Suzuki et al. ................. 356/375 |
| 5,969,820 A | 10/1999 | Yoshi et al. ................. 356/375 |
| 5,982,927 A | 11/1999 | Koljonen ..................... 382/168 |
| 6,047,084 A | 4/2000 | Kent et al. ................... 382/147 |
| 6,286,202 B1 | 9/2001 | Asai et al. ..................... 39/740 |
| 6,317,972 B1 | 11/2001 | Asai et al. ..................... 29/833 |
| 6,332,536 B2 | 12/2001 | Easton ...................... 206/459.5 |
| 6,506,614 B1 | 1/2003 | Strassmann ..................... 438/7 |
| 6,538,244 B1 | 3/2003 | Skunes ..................... 250/208.1 |
| 6,549,647 B1 | 4/2003 | Skunes et al. ............... 382/150 |
| 6,622,054 B1 | 9/2003 | Okuda et al. .................. 700/51 |
| 6,738,505 B1 | 5/2004 | Prince .......................... 382/150 |
| 6,807,725 B2 | 10/2004 | Asai et al. ..................... 29/740 |
| 6,891,967 B2 | 5/2005 | Prince .......................... 382/150 |
| 7,083,082 B2 | 8/2006 | Byskov et al. ............... 235/375 |
| 2001/0040117 A1 | 11/2001 | Easton ......................... 206/714 |
| 2002/0014003 A1 | 2/2002 | Asai et al. ..................... 29/740 |
| 2002/0078580 A1 | 6/2002 | Haugen et al. ............... 33/533 |
| 2002/0099466 A1 | 7/2002 | Diggin et al. ................. 700/114 |
| 2003/0029033 A1 | 2/2003 | Hidese et al. .................. 29/833 |
| 2003/0098426 A1 | 5/2003 | Hayata .................. 250/559.34 |
| 2003/0159515 A1 | 8/2003 | Tonomura ..................... 73/584 |
| 2003/0225547 A1 | 12/2003 | Paradies ....................... 702/150 |
| 2004/0094594 A1 | 5/2004 | Liebeke ........................ 226/32 |
| 2004/0163243 A1 | 8/2004 | Noda et al. ................... 29/834 |
| 2005/0117797 A1 | 6/2005 | Gaida .......................... 382/153 |
| 2005/0123187 A1 | 6/2005 | Bushman et al. ............. 382/141 |
| 2005/0125993 A1 | 6/2005 | Madsen et al. ............... 29/739 |
| 2005/0268460 A1 | 12/2005 | Case ............................ 29/833 |
| 2005/0276464 A1 | 12/2005 | Duquette et al. ............ 382/151 |
| 2006/0016066 A1 | 1/2006 | Gaida et al. ................... 29/740 |
| 2006/0075631 A1 | 4/2006 | Case et al. ..................... 29/709 |

FOREIGN PATENT DOCUMENTS

| | | |
|---|---|---|
| EP | 0 948 250 | 10/1999 |
| EP | 0 959 654 | 11/1999 |
| EP | 1 152 604 | 11/2001 |
| EP | 1 343 363 | 9/2003 |
| GB | 2 317 496 | 3/1998 |
| JP | 62298750 | 12/1987 |
| JP | 63090707 | 4/1988 |
| JP | 01309190 | 12/1989 |
| JP | 02076080 | 3/1990 |
| JP | 02235399 | 9/1990 |
| JP | 5-37918 | 2/1993 |
| JP | 6-249629 | 9/1994 |
| JP | 6-249630 | 9/1994 |
| JP | 6-310899 | 11/1994 |
| JP | 07183697 | 7/1995 |
| JP | 7-77319 | 8/1995 |
| JP | 7-336099 | 12/1995 |
| JP | 8032291 | 2/1996 |
| JP | 8-111598 | 4/1996 |
| JP | 9-021609 | 1/1997 |
| JP | 9-023097 | 1/1997 |
| JP | 9-205299 | 8/1997 |
| JP | 9-210626 | 8/1997 |
| JP | 9-214198 | 8/1997 |
| JP | 9-223898 | 8/1997 |
| JP | 9-246799 | 9/1997 |
| JP | 10136962 | 5/1998 |
| JP | 9-293998 | 9/1999 |
| JP | 11285925 | 10/1999 |
| JP | 2000-022392 | 1/2000 |
| JP | 2000349499 A | 12/2000 |
| JP | 2001-165860 | 6/2001 |
| JP | 2001-168600 | 6/2001 |
| JP | 2001168594 | 6/2001 |
| JP | 2002271099 | 9/2002 |
| JP | 2003-092495 | 3/2003 |
| JP | 2003152392 | 5/2003 |
| JP | 2003-243898 | 8/2003 |
| JP | 2003243899 | 8/2003 |
| JP | 2003-304095 | 10/2003 |
| JP | 2005285840 | 10/2005 |
| WO | EP 932 331 A1 | 7/1999 |
| WO | WO 00/19794 | 4/2000 |
| WO | WO 00/19800 | 4/2000 |
| WO | WO 00/26640 | 5/2000 |
| WO | WO 01/67831 A2 | 9/2001 |
| WO | WO 02/29357 | 4/2002 |
| WO | WO 03/043400 A1 | 5/2003 |

OTHER PUBLICATIONS

The International Preliminary Report on Patentability for foreign application No. PCT/US2004/036238 filed Oct. 29, 2004; Notification of Transmittal of The International Search Report and Written Opinion of the International Searching Authority for application No. PCT/US2004/036238, filed Oct. 29, 2004.

Chinese Office Action from Application No. 02826679.X, filed Nov. 12, 2002.

International Search Report from Appln No. : PCT/US2004/036683, filed Nov. 3, 2004; International Preliminary Report on Patentability from Application No. : PCT/US2004/036683, filed Nov. 3, 2004.

The Notification of Transmittal of International Preliminary Examination Report in foreign application No. 2005/025905, filed Jul. 21, 2005; International Search Report and Written Opinion from foreign application No. 2005/025905, filed Jul. 21, 2005.

The International Search Report from Appln No. PCT/US/2002/36154, filed Nov. 11, 2002.

The International Preliminary Report on Patentability in foreign Appln No. PCT/US/2004/036704, filed Nov. 3, 2004; Notification of Transmittal of the International Search Report and Written Opinion of the International Searching Authority in foreign Appln No. PCT/US/2004/036704, filed Nov. 3, 2004.

The International Preliminary Report on Patentability from Appln. No PCT/US/2005/35985, filed Oct. 5, 2005; copy of International Search Report and Written Opinion from Appln. No. PCT/US/2005/35985, filed Oct. 5, 2005.

* cited by examiner

PICK AND PLACE MACHINE WITH COMPONENT PLACEMENT INSPECTION

CROSS REFERENCE TO RELATED APPLICATIONS

This application claims priority to the following prior provisional applications: Ser. No. 60/338,233 filed Nov. 13, 2001 entitled INSPECTION METHODS FOR A PICK AND PLACE MACHINE; Ser. No. 60/356,801 filed Feb. 13, 2002 entitled PICK AND PLACE MACHINE WITH COMPONENT PLACEMENT INSPECTION; and Ser. No. 60/374,964 filed Apr. 22, 2002 entitled IMPROVED INSPECTION. Each and every provisional application listed above is incorporated by reference herein in its entirety.

COPYRIGHT RESERVATION

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

Pick and place machines are generally used to manufacture electronic circuit boards. A blank printed circuit board is usually supplied to the pick and place machine, which then picks electronic components from component feeders, and places such components upon the board. The components are held upon the board temporarily by solder paste, or adhesive until a subsequent step in which the solder paste is melted, or the adhesive is fully cured.

Pick and place machine operation is challenging. Since machine speed corresponds with throughput, the faster the pick and place machine runs, the less costly the manufactured board. Additionally, placement accuracy is extremely important. Many electrical components, such as chip capacitors and chip resistors are relatively small and must be accurately placed on equally small placement locations. Other components, while larger, have a significant number of leads or conductors that are spaced from one another at a relatively fine pitch. Such components must also be accurately placed to ensure that each lead is placed upon the proper pad. Thus, not only must the machine operate extremely fast, but it must also place components extremely accurately.

In order to enhance the quality of board manufacture, fully or partially populated boards are generally inspected after the placement operation(s), both before and after solder reflow, in order to identify components that are improperly placed or missing or any of a variety of errors that may occur. Automatic systems that perform such operation(s) are highly useful in that they help identify component placement problems prior to solder reflow allowing substantially easier rework or identify defective boards after reflow that are candidates for rework. One example of such a system is sold under the trade designation Model KS 200 available from CyberOptics Corporation of Golden Valley, Minn. This system can be used to identify such problems as alignment and rotation errors; missing and flipped components; billboards; tombstones; component defects; incorrect polarity; and wrong components. Identification of errors pre-reflow provides a number of advantages. Rework is easier; closed-loop manufacturing control is facilitated; and less work in-process exists between error generation and remedy. While such systems provide highly useful inspection, they do consume plant floor-space as well as programming time maintenance efforts and the like.

One relatively recent attempt to provide the benefits of after-placement inspection located within a pick a place machine itself is disclosed in U.S. Pat. No. 6,317,972 to Asai et al. That reference reports a method for mounting electric components where an image of a mounting location is obtained prior to component placement, and compared with an image of the mounting location after component placement to inspect the placement operation at the component level.

While the disclosure of Asai et al. marks one attempt to employ in-machine component level inspection, there remains much work to be done. For example, the disclosure of Asai et al. is primarily related to turret-style pick and place machines, where the placement position does not move in the x and y directions, but simply moves up and down. In such systems, relatively large and heavy imaging systems can be provided proximate the nozzle(s), image a plurality of placement events and still have little, or no, adverse impact on placement machine speed or design layout. In contrast, on gantry-style pick and place machines (given relatively little attention by Asai et al.) the nozzle moves in at least one of the x and y directions. Thus, optics intended to image a plurality of placement events also move in x and/or y. Accordingly, the size and mass (inertial load) of the optical system itself can be prohibitive of on-head use in gantry-style machines. Further, since the head of a gantry-style pick and place machine is moving in x and/or y, it is important to minimize the size of the optical system to reduce the possibility that it will collide with other portions of the pick and place machine.

For pick and place machines having heads that move in x and/or y, increased mass is an issue because of the increased inertia. Achieving a certain machine throughput is dependent, in part, on the head's acceleration. Given a certain motive power provided by the electromechanical system of the pick and place machine, increased mass causes decreased acceleration.

Size, that is volume and/or shape of the optical system attached to the moving head, can also be a problem for a number of reasons. One reason is that the head may be designed so as to just fit in its environment as it moves about its workspace without colliding with anything. Adding something that protrudes beyond the spatial envelope of the existing head structure must be done with care and consideration of the possibility of physical conflict. Another reason that the size and/or shape of the head can become a problem is that there are generally a relatively large number of cables, tubes, motors, and other structures mounted to the head. Adding something that may conflict with assembly or maintenance of the machine is generally disfavored.

To increase the viability of component level placement inspection in a pick and place machine, it would be advantageous to improve aspects of the optical system, the illumination system, image acquisition, and image processing without adversely affecting machine throughput or design. Further, it would be advantageous to provide optical systems and techniques that are practicable in both turret-style and gantry-style pick and place machines.

SUMMARY OF THE INVENTION

Embodiments of the present invention improve upon component level inspection performed by pick and place machines. Such improvements include stereovision imaging of the intended placement location; enhanced illumination to facilitate the provision of relatively high-power illumination in the restricted space near the placement nozzle(s); optics to allow image acquisition device to view the placement location from an angle relative to a plane of the placement location, thereby reducing the possibility of such images being obstructed by the component; techniques for rapidly acquiring images with commercially available CCD arrays such that acquisitions of before and after images do not substantially impact system throughput; and image processing techniques to provide component inspection and verification information. These and other advantages of embodiments of the present invention will be apparent from the description below.

DETAILED DESCRIPTION OF THE ILLUSTRATIVE EMBODIMENTS

Although embodiments of the present invention will be described with respect to a gantry-style pick and place machine, those skilled in the art will recognize that embodiments of the present invention are applicable to other forms of pick and place machines.

Figure 1:
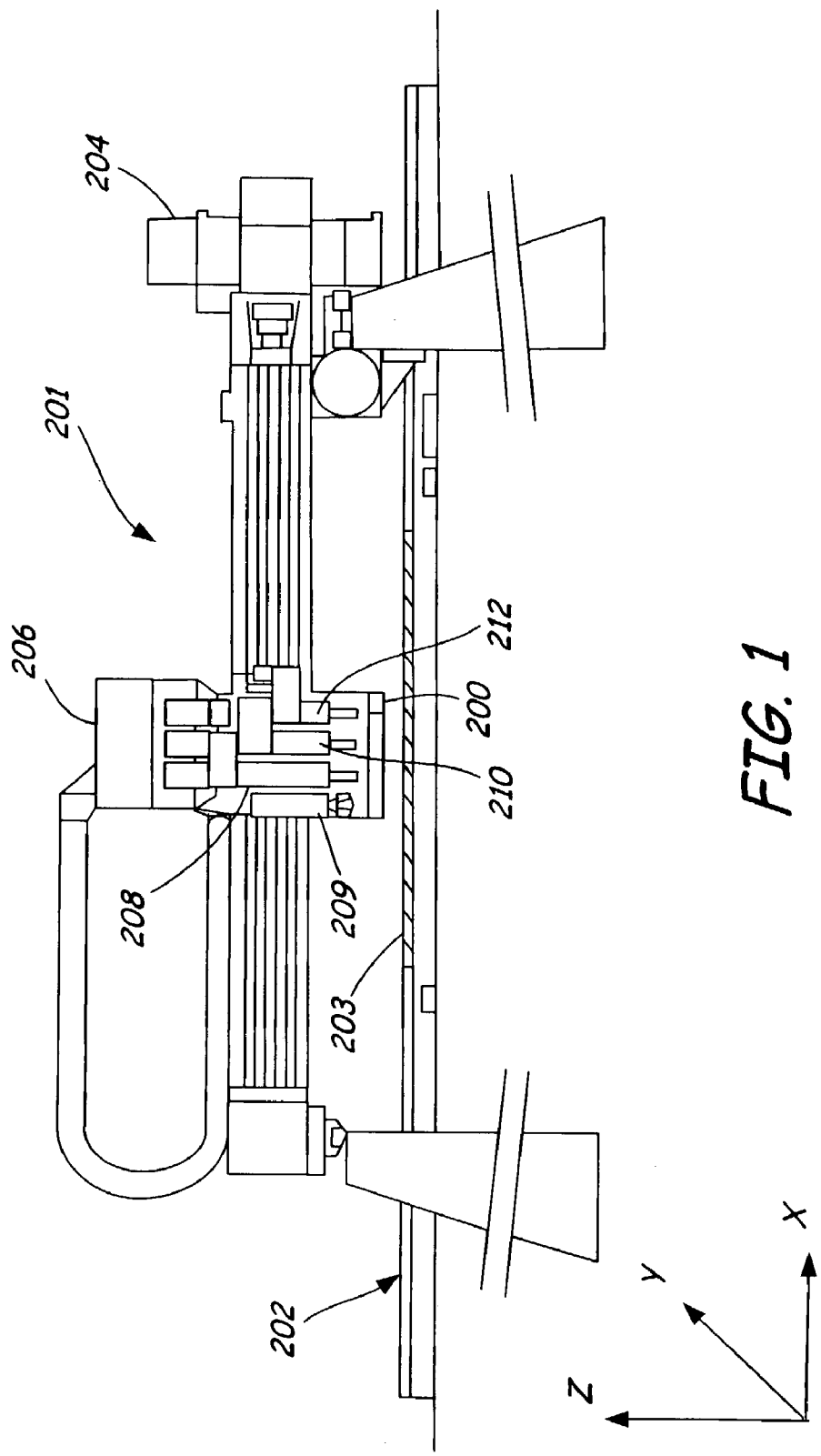
FIG. 1 is a diagrammatic view of a pick and place machine with which embodiments of the invention can be practiced.

FIG. 1 is a diagrammatic view of an exemplary pick and place machine 201 with which embodiments of the present invention are applicable. Pick and place machine 201 receives a workpiece, such as circuit board 203, via transport system or conveyor 202. A placement head 206 then obtains one or more electrical components to be mounted upon workpiece 203 from component feeders (not shown) and moves in x, y and z directions to place the component in the proper orientation at the proper location upon workpiece 203. Placement head 206 may include a sensor 200 that may pass under components held by nozzles 208, 210, 212 as placement head 206 moves the component(s) from pickup locations to placement locations. Sensor 200 allows placement machine 201 to view undersides of components held by nozzles 208, 210, 212 such that component orientation and, to some degree, component inspection can be effected while the component is being moved from the component pick-up location to the placement location. Other pick and place machines may employ a placement head that moves over a stationary camera to image the component. Placement head 206 may also include a downwardly-looking camera 209 which is generally used to locate fiducial marks upon workpiece 203 such that the relative location of placement head 206 with respect to workpiece 203 can be readily calculated.

Figure 2:
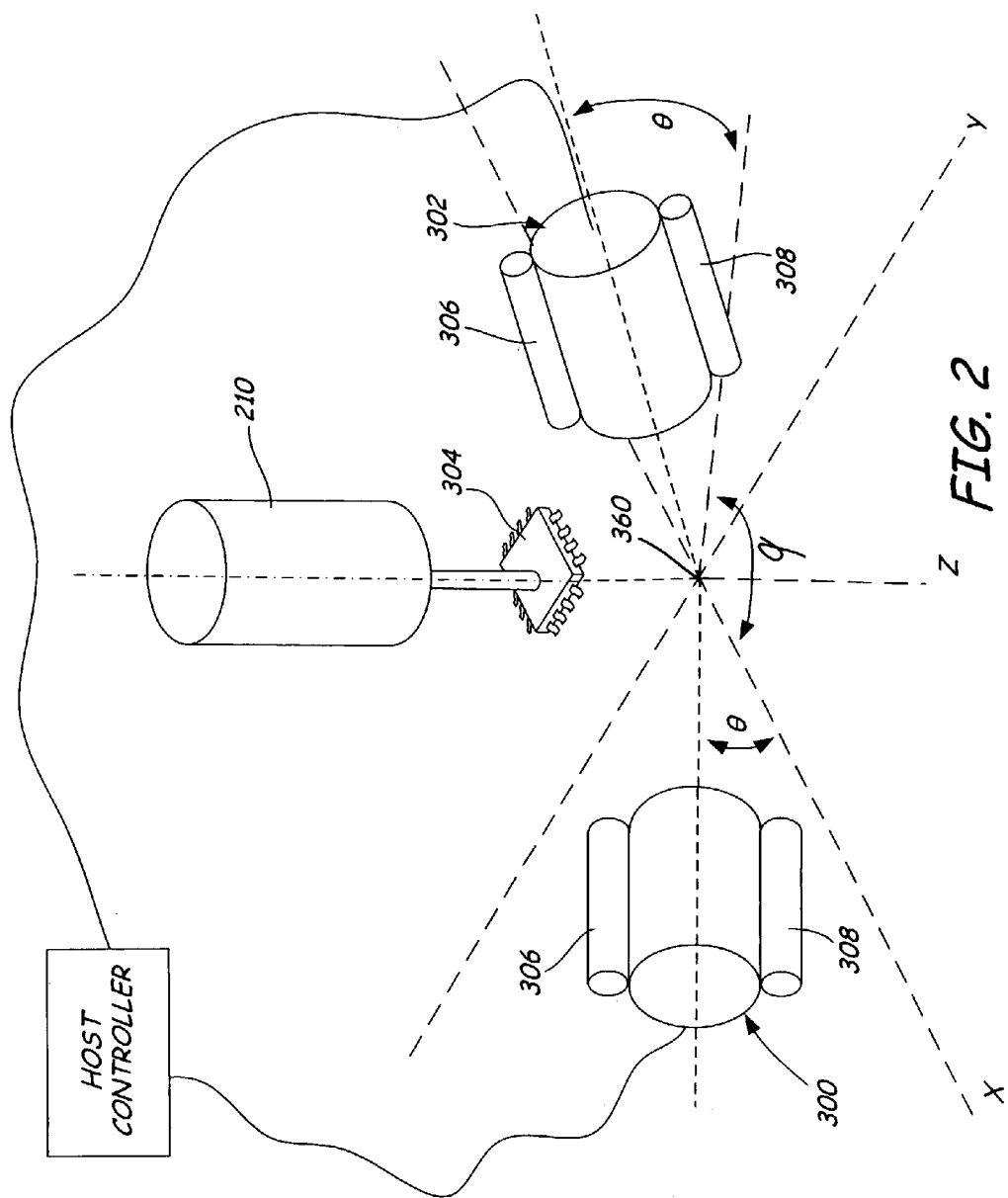
FIG. 2 is simplified diagrammatic view of a stereovision image acquisition system in accordance with embodiments of the present invention.

FIG. 2 is a diagrammatic view of a placement head in accordance with embodiments of the present invention. FIG. 2 illustrates a pair of image acquisition devices 300, 302 disposed to acquire images of placement location 360 of component 304 before component 304 is deposited by nozzle 210 upon location 360. Devices 300 and 302 obtain images of placement location 360 on workpiece 203 prior to placement of component 304, and then shortly thereafter. A comparison of these before and after images facilitates component-level placement inspection and verification. Since acquisition of images of the placement location is generally done when the nozzle, such as nozzle 210, holds the component 304 above the placement location, it is important to be able to image placement location 360 while minimizing or reducing interference from the component itself or adjacent components which may be already mounted upon the workpiece. Thus, it is preferred that devices 300, 302 employ an optical axis allowing views that are inclined at an angle θ with respect to the plane of workpiece 203. In order to compensate for the angle θ from which devices 300, 302 view placement location 360, it is preferred that devices 300, 302 be adapted to employ the Scheimpflug condition. One particular way in which the Scheimpflug condition can be employed is adapting the area array detector within each of devices 300, 302 to be disposed at an angle with respect to the optical train axis of the respective device 300, 302. Under this condition, the tilted object plane (placement location) is imaged properly onto the tilted image plane (area array detector within device 300, 302).

As illustrated in FIG. 2, devices 300, 302 are also preferably angularly spaced by an angle φ about the z-axis such that devices 300, 302 provide stereovision imaging of placement location 360. Such stereovision imaging provides a number of benefits which will be described in greater detail below. Stereovision imaging of the before and after condition of the placement location allows height maps to be generated with x-y data. Two advantages of stereovision imaging are: the generation of a depth map of the intended component placement location; and the ability to minimize, or at least reduce, the possibility that the component view will be occluded by another taller component along the line of sight. If the component view is occluded from one point of view, it will generally still be visible with the other camera.

Each of devices 300, 302 also preferably includes non-structured illuminator 306 and structured illuminator 308. While non-structured illuminators 306 are illustrated as disposed on each of devices 300, 302, it may be possible, in some embodiments, to provide a single non-structured illuminator mounted separately.

The system illustrated in FIG. 2 provides a number of features that can be used alone, or in combination to provide advanced component inspection. One way in which the system can be used is by employing structured light to reconstruct heights from any one view of placement location 360. Another way is to use structured light simply as an illumination source to provide patterns of light on the surface of the location 360, then use known correlation algorithms such as that reported by Rosenfeld, A., and A. C. Kak, 1982. Digital picture processing. Volume 2. Academic Press, New York to correlate the structured illumination between two images acquired from different views and from the two stereo images to compute a map of heights of the surface of the board, either pre or post placement. As used herein, structured light includes sinusoidal patterns, a regular array of spots or shapes, a random pattern of light, and even pseudo-random patterns of light. Occasionally, there will be situations and nozzle configurations when some portions of the workpiece surface do not appear in one of the images. Additional cameras can be arranged to view portions of the surface of the workpiece which are likely missing from one or more of the images. Alternately, it may be possible to piece together the missing image portion from other views, pre or post placement, to acquire the necessary images to provide either the information about the quality of placement, or the stereo information necessary to provide height information.

Figure 3:
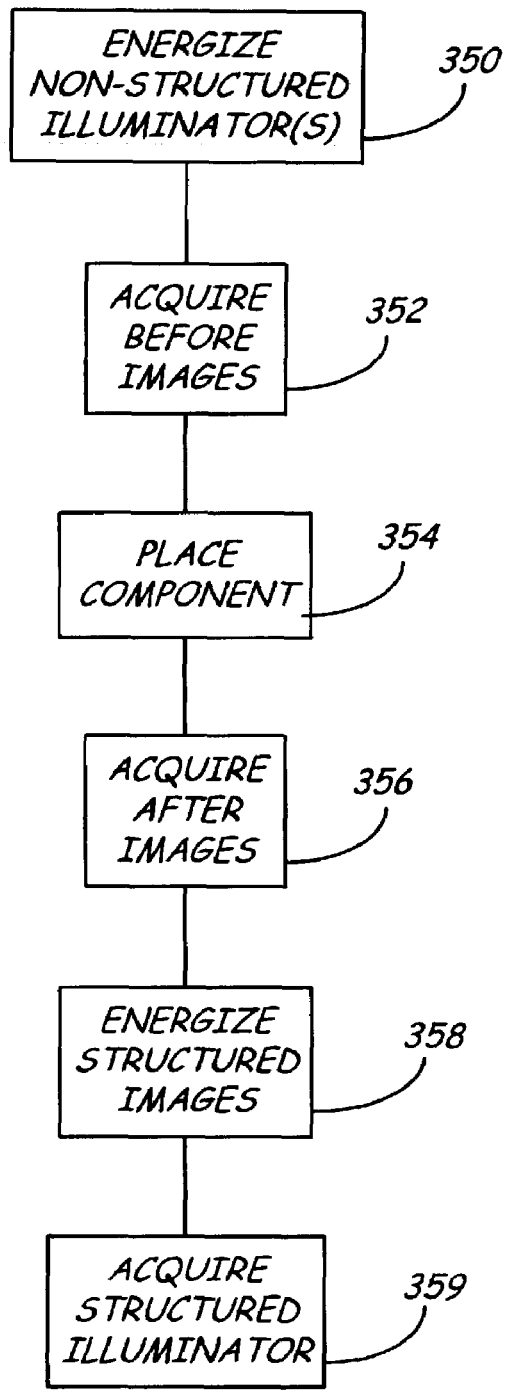
FIG. 3 is a flow diagram illustrating a method of operating a pick and place machine in accordance with an embodiment of the present invention.

FIG. 3 is a flow chart of a method of obtaining images in order to provide component-level inspection in a pick and place machine. At step 350, one or more non-structured illuminators (such as illuminators 306) are energized to illuminate the intended placement location prior to component placement. At step 352, each of devices 300, 302 acquire a pre-placement image of the placement location while it is illuminated with non-structured illumination. Preferably, devices 300, 302 acquire their respective images simultaneously, or at substantially the same time as each other. As used herein, substantially the same time means close enough in time that the physical system has not moved appreciably between image acquisitions. Thus, stereovision pre-placement image acquisition is effected at step 352 and the non-structured illuminator(s) are de-energized. Optionally, stereovision before-images or images of structured illumination upon the intended component placement location can be used for pre-placement inspection operation. Such operations include: the verification that solder paste is deposited in appropriate positions to receive associated component leads; that no debris or other undesirable material is located in the intended placement location; or any other inspection operations as may be desired.

A structured illumination image can be acquired from each image acquisition device to provide three-dimensional image information of the intended component placement location prior to component placement. In the event that each image acquisition device uses its own structured illuminator, the image acquisition devices should acquire their respective images sequentially such that structured illumination from one image acquisition device does not interfere with that of the other. However, if suitable structured illuminators are used, such that the structured illumination from each illuminator can be disambiguated in processing, then the image acquisition devices can each acquire their respective structured illumination images simultaneously.

At step 354, the nozzle, such as nozzle 210, places the component in its intended placement location. At step 356, devices 300, 302 again obtain a stereovision image of the placement location, post placement. Optionally, at step 358, structured illuminators 308 can be energized to impart structured illumination upon component 304 as it sits in its intended placement location. Devices 300, 302 can then optionally obtain yet another set of stereovision images while the intended placement location is illuminated with structured illumination (block 359). Optional steps 358 and 359 facilitate the generation of a three-dimensional reference point image of the intended placement location, post placement.

Figure 4:
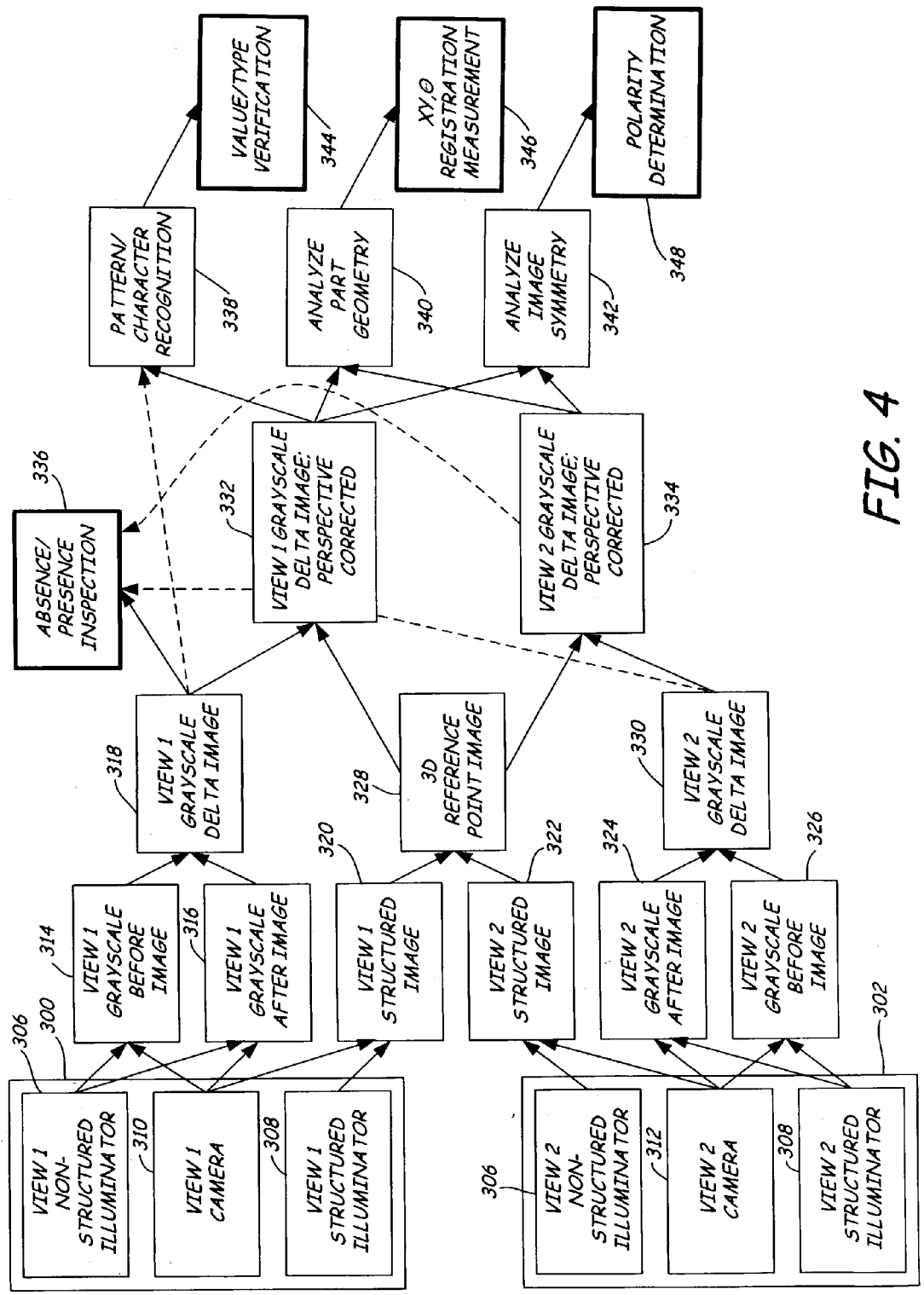
FIG. 4 is a block diagram illustrating how various images can be used and/or combined to provide component placement inspection in accordance with an embodiment of the present invention.

FIG. 4 is a diagrammatic view of how the various illuminators and image acquisition devices are used to generate various images and how those images combine to provide important inspection information. As illustrated in FIG. 4, device 300 includes non-structured illuminator 306, camera 310, and structured illuminator 308. Device 302 includes non-structured illuminator 306, camera 312, and structured illuminator 308. As can be seen, camera 310 and non-structured illuminator 306 of device 300 cooperate to generate both gray-scale before image 314 and gray-scale after image 316, which images are then used to generate a gray-scale difference (delta) image 318 corresponding to the view from device 300. Additionally, camera 310 and structured illuminator 308 cooperate to generate the structured image 320 from the view of device 300.

Device 302 produces images 322, 324 and 326 similar to that described above with respect to device 300, but from a different view such that stereovision images are facilitated. Specifically, image 322 is preferably acquired simultaneously with or substantially simultaneously with the acquisition of image 320. Similarly, images 324 and 326 are acquired at substantially the same time as images 316 and 314, respectively. The two structured illumination images 320 and 322 taken from the different views of devices 300, 302, respectively, can be combined to provide three dimensional reference point image 328. Additionally, the gray-scale images obtained by device 302 can be combined to provide gray-scale delta image 330. The three dimensional reference point image 328 is used to correct each of the gray-scale delta images 318 and 330 for perspective, thereby forming first and second view gray-scale delta images with corrected perspectives, 332 and 334, respectively. The perspective-corrected gray-scale images 332 and 334 can then be used for a number of component placement inspections. Examples of such inspections can include absence/presence inspection, as indicated at block 336; pattern/character recognition as indicated at block 338, part geometry analysis as indicated at block 340, and image symmetry analysis as indicated at block 342. Pattern/character recognition 338 on the component 304 itself facilitates verification of the correct type and value of component 304, as indicated at block 344. Additionally, by analyzing part geometry, x, y and rotational (θ) registration can be measured and verified, as indicated at block 346. Finally, analyzing image symmetry, as indicated at block 342, can provide a convenient approach to analyze component polarity as indicated at block 348.

Illumination

The following aspects of illumination provide added benefits for embodiments of the present invention. In fact, aspects of the illumination disclosed below include aspects of the present invention, and need not necessarily be practiced using the stereovision techniques disclosed above.

Adequate image quality often requires fairly bright illumination due to needs for high resolution, short image acquisition time, low target object reflectivity toward the camera, and other causes. Light Emitting Diodes (LEDs) are often a good choice for a light source since they are generally reliable, efficient, inexpensive, and compact. However, the space near the point of placement in a pick and place machine may be so severely restricted that positioning the required LEDs near the point of placement is very difficult.

In such a situation, it is advantageous to use light pipes, particularly fiber light pipes, to convey light from remotely placed LEDs to the target area. Advantages of using light pipes in pick and place machines include: the space required by a sufficiently large number of LEDs required for bright illumination would potentially be too bulky for mounting near the point of placement; heating in the vicinity of the nozzles (problematic because it changes the dimensions of components, the nozzle, and any other heated materials, by virtue of thermal expansion) is reduced by removing the LEDs sources from the point of placement; the LEDs can be arranged to optimize packaging; and fiber light pipes are flexible and can be suitably arranged to allow for delivery on a moving placement head with a stationary LED source.

Many applications require suitably arranged illumination to reveal the features or details necessary for further processing. In some instances, either for the efficient utilization of space or to better match some inherent symmetry of the imaging geometry, it is desirable to arrange the illumination to complement the symmetry. Examples include the use of large ring lights to form uniform circular features on spherical solder balls, or the use of linear illuminators to greatly reduce the size of linescan cameras.

Commercially available illumination configurations are often merely rectangular or circular arrays of discretely packaged or chip-level LEDs. While either of these LED packages can be physically arranged in arbitrary configurations, the size of the discrete packages limits the arrangement to coarse spacings; and chip-level illuminator arrays are usually restricted to flat planes. In either case, realizing an arbitrary arrangement can be an complex and expensive undertaking.

LEDs, or other suitable light sources, coupled to flexible fiber light pipes, provide an adaptable and straightforward technique to realize nearly arbitrary illumination configurations. The complexity of the desired placement and orientation of the light sources resides in how the output ends of the fibers are held. Since the fibers suitable for use as light pipes are generally quite flexible and of a relatively small diameter (0.25 to 1.0 mm), the arrangement can be accomplished by fixing the output ends of the fiber light pipes into one or more suitably machined pieces.

Efficient coupling of fiber light pipes to the LEDs typically requires a lens between the LED package or die and the fiber input end. Each LED lens and fiber must be held in tight alignment. The entire assembly then becomes somewhat bulky and does not lend itself to custom arrangements, particularly if a one-piece lens array is used.

One aspect of the illumination features in accordance with embodiments of the invention includes the direct coupling of a fiber light pipe input end directly to an LED.

Figure 5:
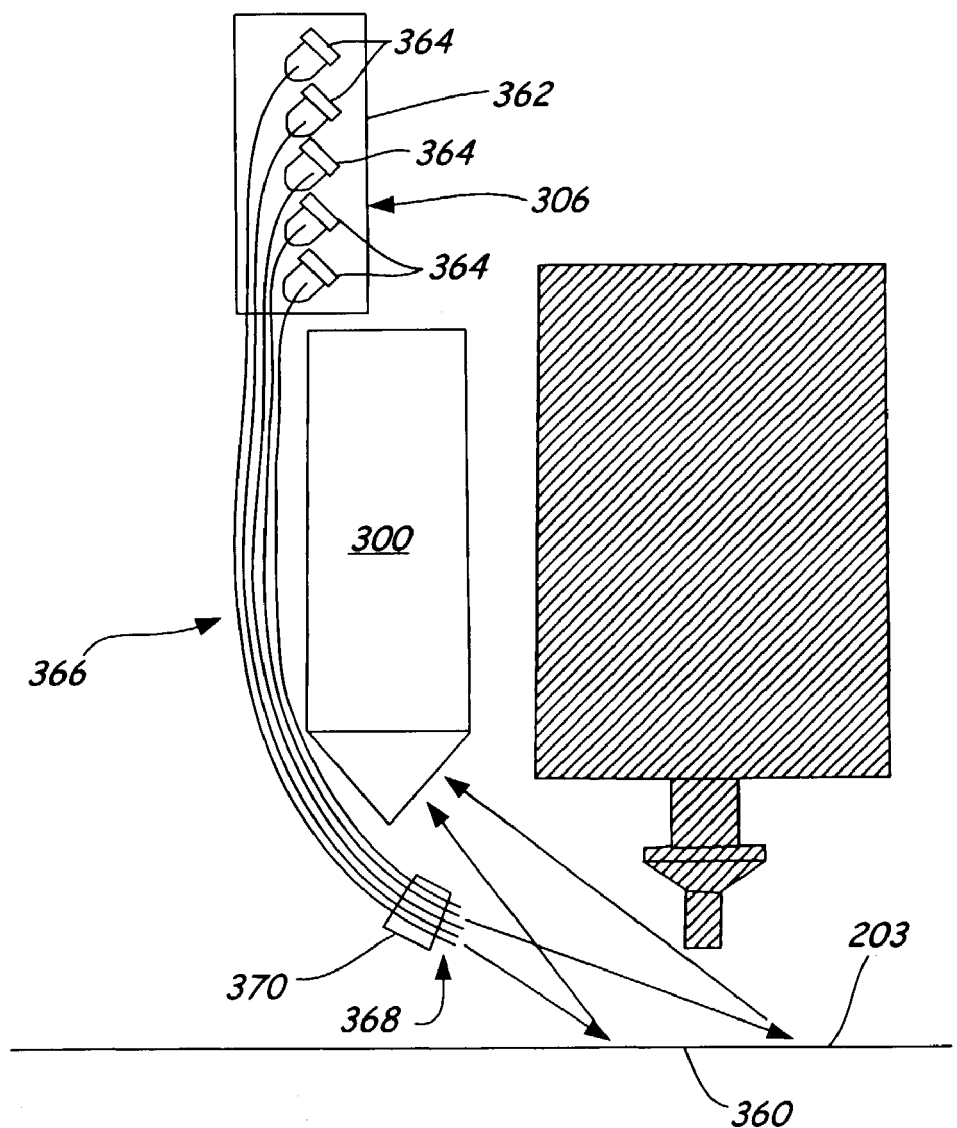
FIG. 5 is a diagrammatic view of an illumination system in accordance with an embodiment of the present invention.

FIG. 5 is a diagrammatic view illustrating aspects of illumination features of embodiments of the present invention. FIG. 5 illustrates nozzle 210 and image acquisition device 300 disposed relative to board 203 such that device 300 acquires an image of placement location 360 while placement location 360 is illuminated by illumination system 306. Illumination system 306 preferably comprises an array of individual point light sources, such as LED array 362 having a plurality of individual LEDs 364. An appropriate number of light pipes 366 are coupled to individual sources 364 and convey illumination from array 362 to a location near placement location 360. Preferably, output ends 368 of light pipes 366 are coupled proximate a fixture 370 that mounts the output ends 368 of light pipes 366 in any desired fashion. The output ends 368 can be bundled, arranged and/or contoured such that the illumination is directed in suitable angles and at suitable locations onto placement site 360 to provide suitable brightness and/or contrast in the images; as well as providing desired image feature shapes or appearances. Further, output ends 368 can be bundled, arranged and/or contoured to accommodate the size, space and other mechanical constraints of the placement head.

Figure 6:
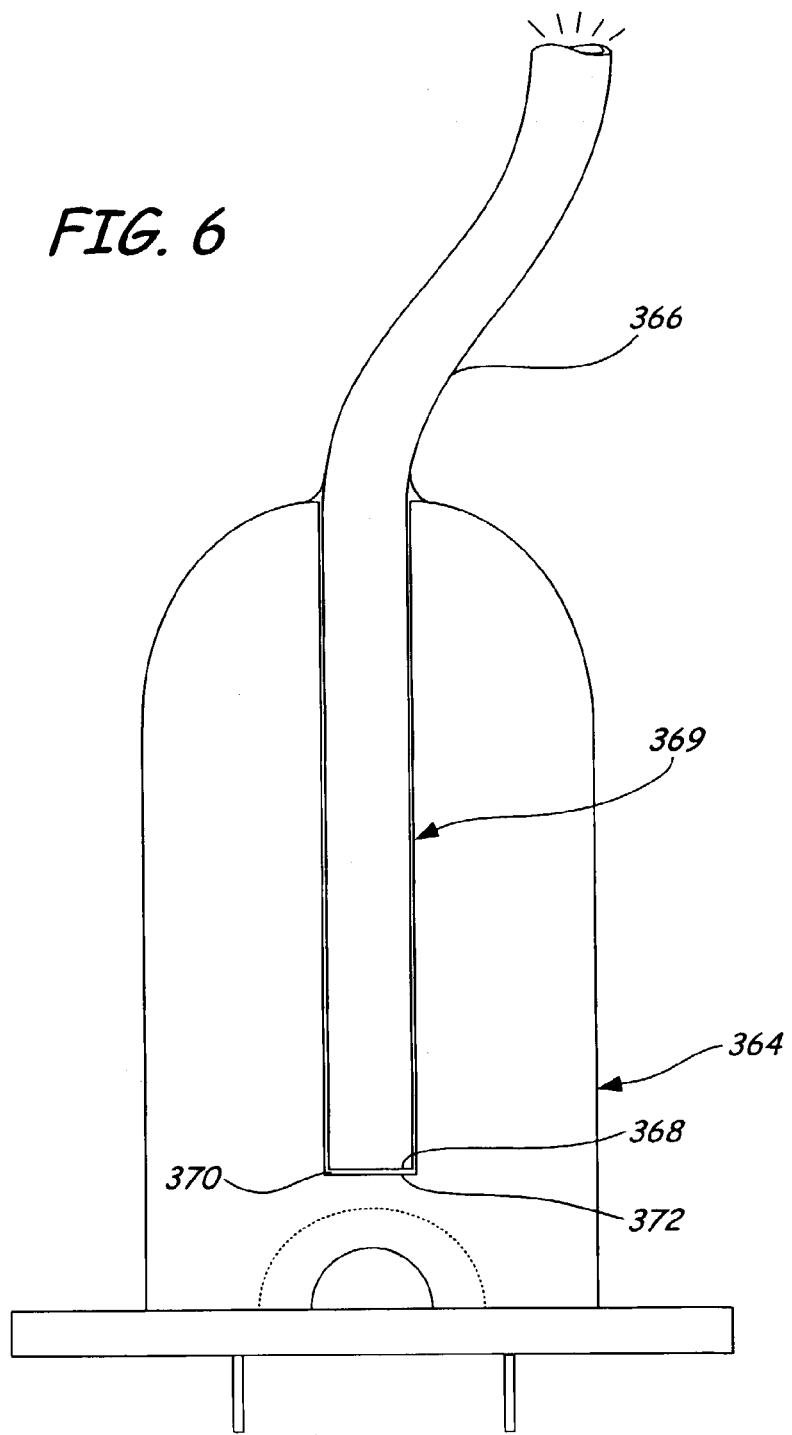
FIG. 6 is an enlarged view of a light pipe mounted to a Light Emitting Diode (LED) in accordance with an embodiment of the present invention.

FIG. 6 is a diagrammatic view of an input end 368 of fiber light pipe 366 coupled to LED 364. Hole 369 is generated in a portion of the package or encapsulation of LED 364 to accommodate light pipe 366. In this manner, fiber end 368 can be placed very near the LED die resulting in high geometric coupling efficiency. Further, space 370 between fiber ends 368 and LED encapsulation or package acrylic 372 can be filled with an index-matching adhesive. However, if an acrylic fiber is used for light pipe 366, fiber 366 and the LED package can be simple fused together resulting in low losses. This arrangement provides a relatively high efficiency coupling without the need for a coupling lens. Moreover, the alignment is fixed and stable and can be configured for optimal packaging. For example, the fibers can be allowed to exit the assembly at relatively odd angles. Further still, the LED and optical fiber assembly can be potted to increase ruggedness.

In some embodiments, all LEDs of array 362 are of one color. Preferably, the image acquisition device then includes a filter which rejects ambient light, but passes light having wavelengths of the band of illumination. However, it is expressly contemplated that LEDs of several colors may be used and one or more appropriate filters used therewith.

Optics

Not only must illumination systems in accordance with embodiments of the present invention be extremely compact and accommodating, but the inspection cameras themselves must accommodate severe restrictions on size, shape and viewing access to the area to be imaged. While it is preferred that both imaging and illumination components be packaged into a single, integrated and cooperative unit, such integration is not necessary to practice embodiments of the present invention.

As described above, image acquisition systems 300, 302 preferably employ a tilted image plane to allow devices 300, 302 to use relatively high viewing angles and properly map those angles back onto imaging arrays. One example of using such a tilted image plane is the Scheimpflug condition. While this technique can be used with both telecentric and non-telecentric optics, it is preferred that embodiments of the present invention employ non-telecentric optics. This is simply because one of the requirements for telecentric imaging optics is that the objective element of telecentric imaging optics must be larger than the field of view.

Figure 7:
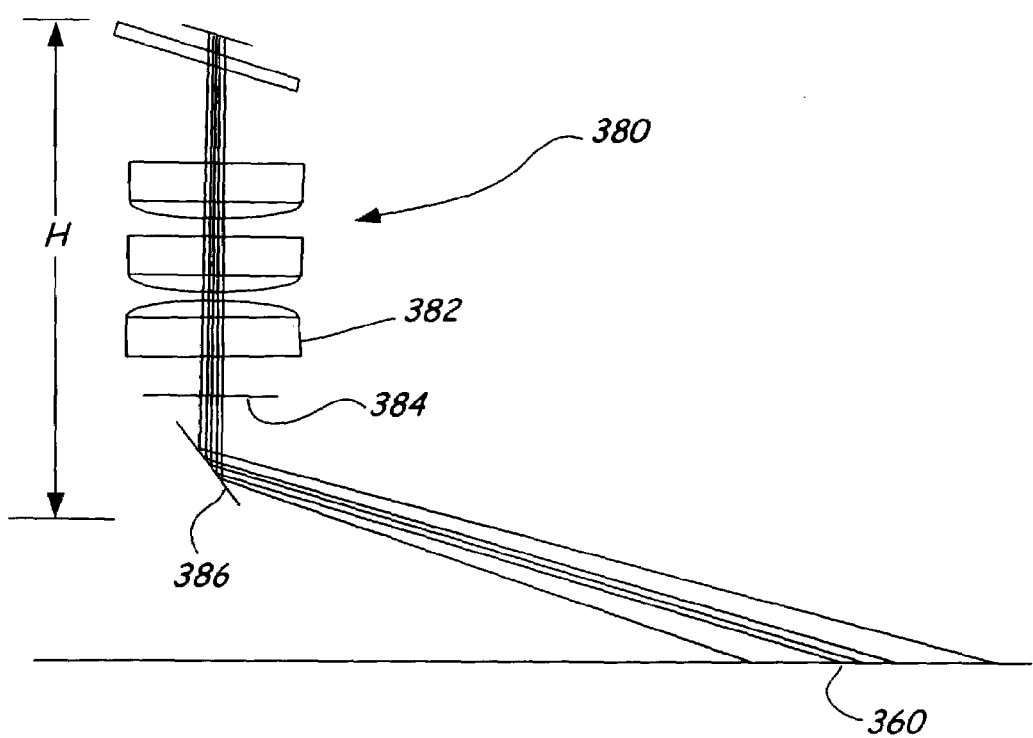
FIG. 7 is a diagrammatic view of an optical train of an image acquisition system of a pick and place machine employing the Scheimpflug condition.

FIG. 7 is a diagrammatic view of an optical system preferably employed within either or both of devices 300, 302. Optical system 380 is non-telecentric thereby allowing objective element 382 to have a diameter smaller than the field of view. Moreover, since system 380 is non-telecentric, height H can be reduced to provide a compact camera as compared to a telecentric optical system. In order to increase the angular access of lines of sight to placement location 306, and/or minimize the optical system diameter, optical stop 384 is interposed between objective element 382 and placement location 360. Further, stop 384 can also be used to help reject ambient light. A mirror 386 can be used to bend the optical axis as illustrated in FIG. 7. It is preferred that optical stop 384 be positioned between objective element 382 and mirror 386.

Figure 21:
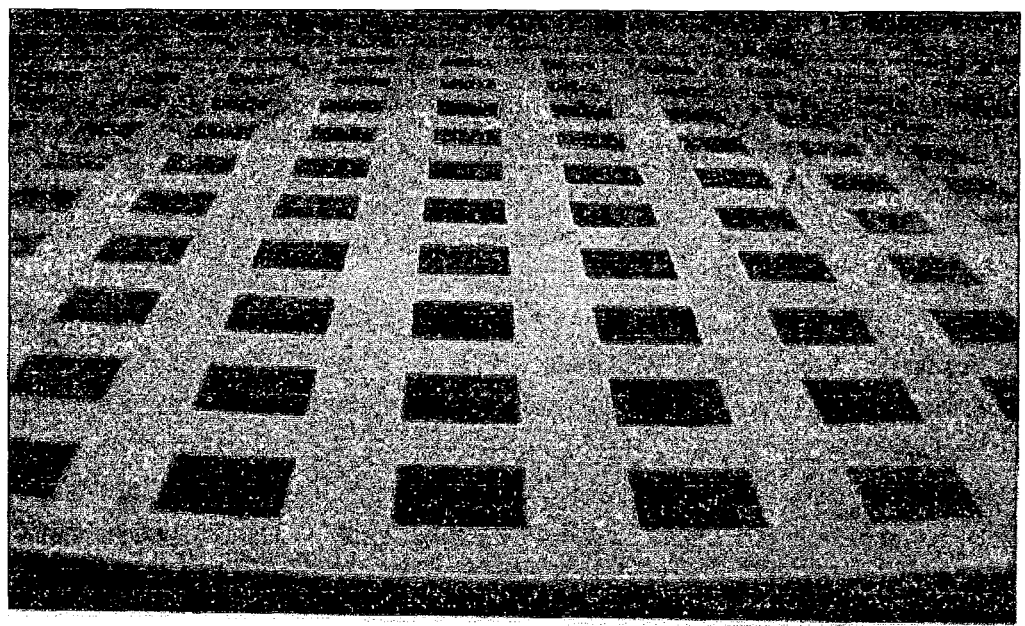
FIGS. 21 and 22 are diagrammatic views of a calibration target in accordance with embodiments of the present invention.

When non-telecentric optics are used, it is recommended that a calibration procedure be performed in order to map x, y pixel addresses to x, y locations on the intended component placement plane. This can be done by placing a calibration target on the plane of the placement area where the target has a number of known indicia, preferably squares of known sizes with known spacing. Then, viewing the known calibration target on the plane of the placement area, allows the system to solve for a 3×3 homogeneous, perspective transformation matrix. This matrix transforms x, y pixel addresses to x, y locations on the placement plane, preferably in millimeter units. This transformation also corrects for scaling as well as perspective distortion. Additionally, using two or more cameras facilitates calibration for stereopsis in order to derive depth (z) data from features visible in the two or more cameras. Z data is useful to project features with height down to the placement plane in a perpendicular direction. FIG. 21 illustrates a preferred calibration target. An image of the calibration target is processed by thresholding the image into a binary image. To locate the black squares, connectivity analysis is performed. Then, lines are precisely fit with a sub-pixel accuracy to each side of each square in the gray-scale image. The intersections of all adjacent lines are then computed. If a selected number of squares are visible in the image (such as 30 squares) then the number of squares, times the number of corners (30×4) provides a relatively large number (such as 120) of points where x, y are computed with high sub-pixel precision. These locations are then compared to the known corner locations in millimeters on the target to compute the calibration matrix.

Figure 22:
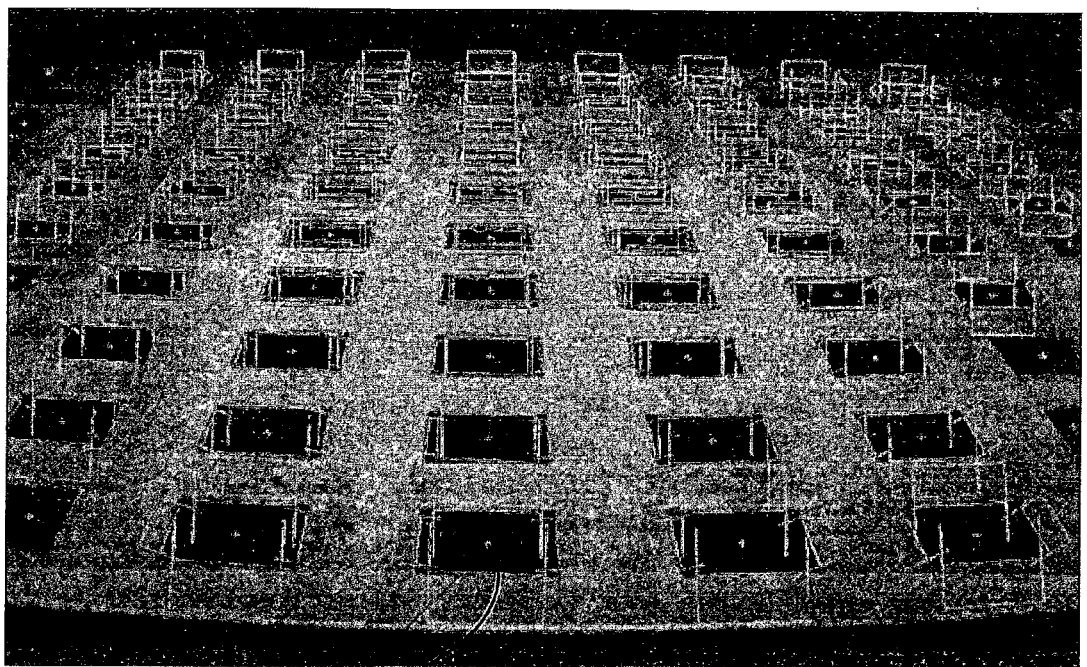

FIG. 22 illustrates an image of the calibration target during processing where the plus symbols indicate "blob" centroids and the placement of line fitters are evident on the sides of the squares as rectangles. To handle extreme perspective, the algorithm starts with the largest blob in the image (indicated at 600). The calibration matrix is continuously refined by including squares closest to the largest one, then including more and more until all of the squares in the grid are used in the final calculation. The calibration steps are as follows. First, all blobs are extracted from the image. Clipped blobs are discarded and the blob with the largest area is located. Then, the four corners of the largest area blob are roughly located. A line fitter is used to fit lines to the four sides of the large square. Then, the system solves for a 3×3 homogeneous transformation matrix with rotation, scaling, and perspective correction, transforming pixel units to millimeter units. This is a relatively rough estimate that will make the two-dimensional array of squares orthogonal in the image. Then, a two-dimensional grid of blob pointers is generated that points to the blobs found previously. This is based on the known millimeter spacing in the calibration grid. Then, a loop begins starting with the blobs in the grid that are +/− one row and +/− one column (there could be as many as nine blobs) of the largest blob. For each blob in the loop, blob centroids are used along with the four corners of the largest blob to solve for a new 3×3 pixel-to-millimeter transformation. Using the refined transformation, the two-dimensional grid of blob pointers is regenerated to point to the blobs found earlier. The usable grid is then expanded around the blobs currently used by the +/− one row and +/− one column. If the grid expansion is already filled, then the loop ends. Otherwise, the loop continues with the next blob. Once the loop has completed, the blob centroids are transformed using the final calibration matrix computed during loop execution. Line fitters are then placed on all four sides of all blobs in the grid and corners are computed on all blobs in the grid by solving for the intersection of all adjoining fit lines. Finally, using all corners found in the image and as well as their expected locations knowing the square sizes and the grid spacing in the calibration target, the final calibration matrix is solved.

Calibrating for stereopsis provides depth data from features visible using two or more cameras. Calibration of two or more cameras with overlapping fields can be performed by performing the above-described calibration twice. After-performing the calibration on a calibration target coincident with the placement plane, a taller calibration target (with known height) is then used and the calibration is repeated. By analyzing the directions and magnitudes of the spatial shifts of image features in each camera image due to the different location of the calibration target, and comparing the shifts amongst the cameras, depth can be determined. Distance from a camera is inversely proportional to the magnitude of the image shift.

Image Acquisition

Embodiments of the present invention generally obtain two or more successive images of the intended placement location (i.e. before placement and after). Since placement occurs relatively quickly, and since slowing machine throughput is extremely undesirable, it is sometimes necessary to acquire two successive images very quickly since cessation of the relative motion between the placement head and the board is fleeting. For example, it may be necessary to acquire two images within a period of approximately 10 milliseconds.

In accordance with various aspects of the present invention, rapid acquisition of multiple successive images can be done in different ways. One way is using commercially available CCD devices and operating them in a non-standard manner to acquire images at a rate faster than can be read from the device. Another way is using multiple CCD arrays arranged to view the intended placement location through common optics.

Figure 8:
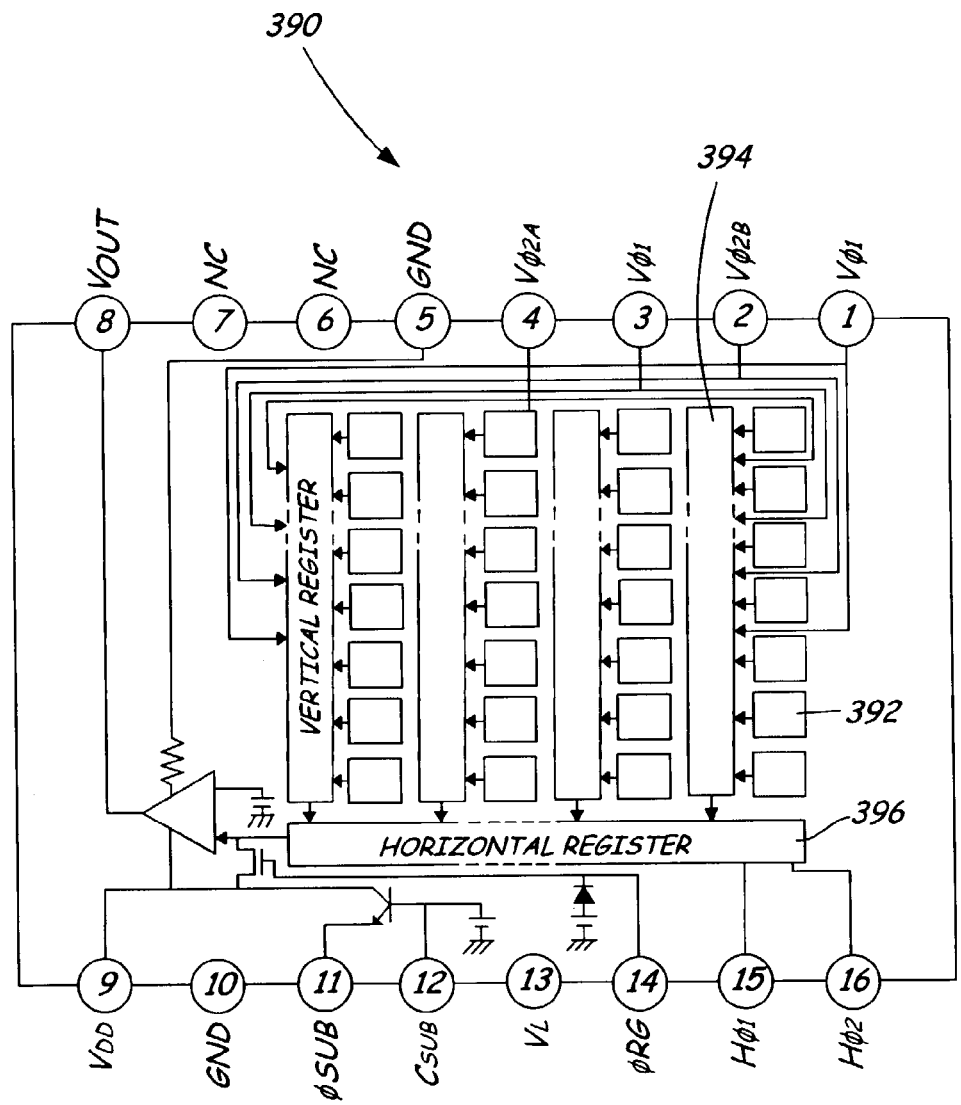
FIG. 8 is a diagrammatic view of an interline transfer CCD array useful with embodiments of the present invention.
Figure 11:
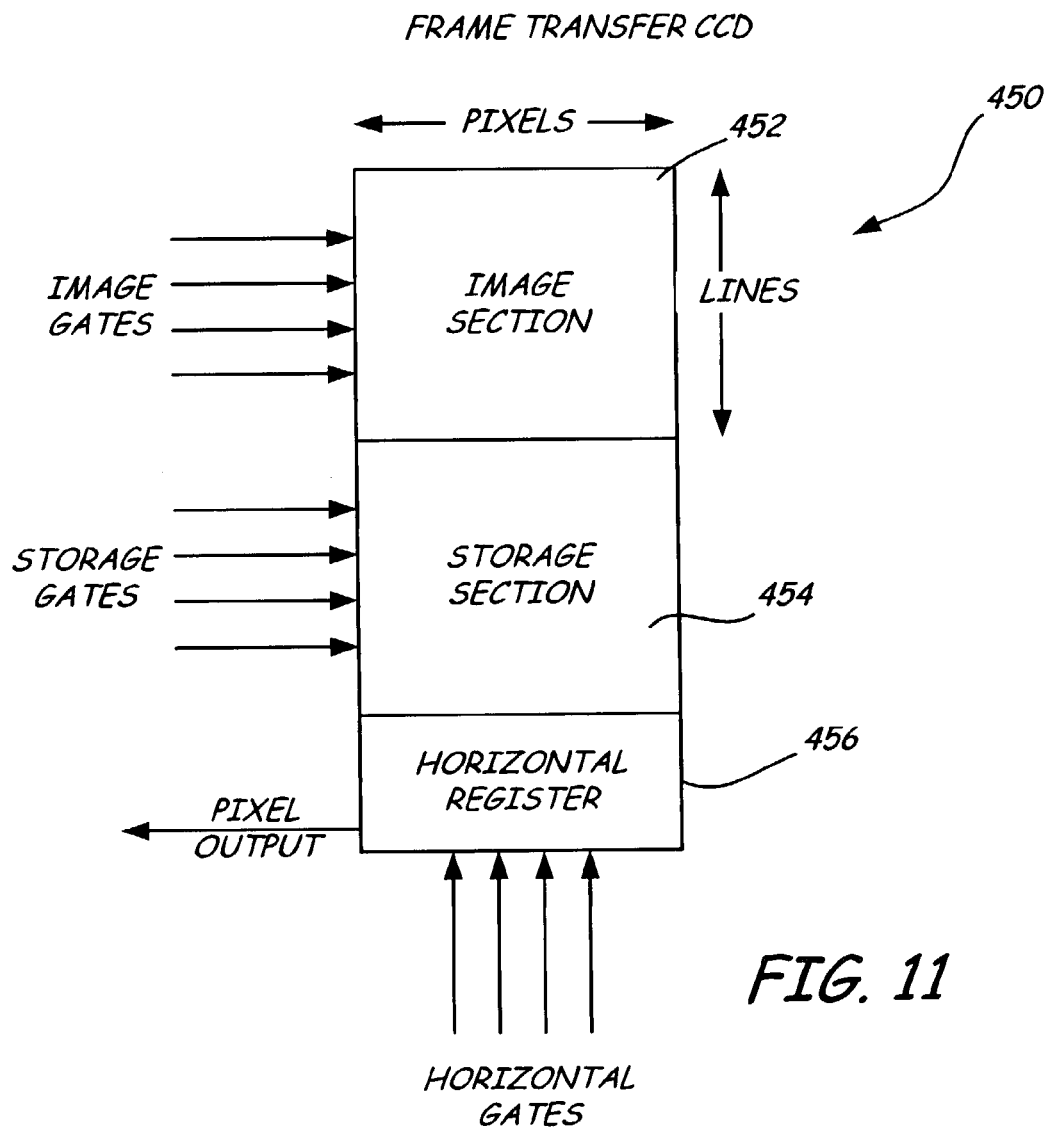
FIG. 11 is a diagrammatic view of a frame transfer CCD array with which embodiments of the present invention are useful.

There are presently two common types of architectures of CCD arrays: the interline transfer CCD array (illustrated in FIG. 8) and the frame transfer CCD array (illustrated in FIG. 11) (herein referred to as IT and FT, respectively). Both types can be generalized to a device that includes an image area that accumulates charge in proportion to its exposure to light and a storage area that is shielded from light. The image area of the CCD is a two-dimensional array of photosites (herein referred to as pixels). The storage section and how the image is transferred to and through it is an important part of what differentiates the two device types. In the IT CCD, the entire image is transferred from the image to the storage section sites proximate the photosites in a few clock cycles, while the FT CCD transfers the image one line at a time from the image section to the storage section.

Figure 10:
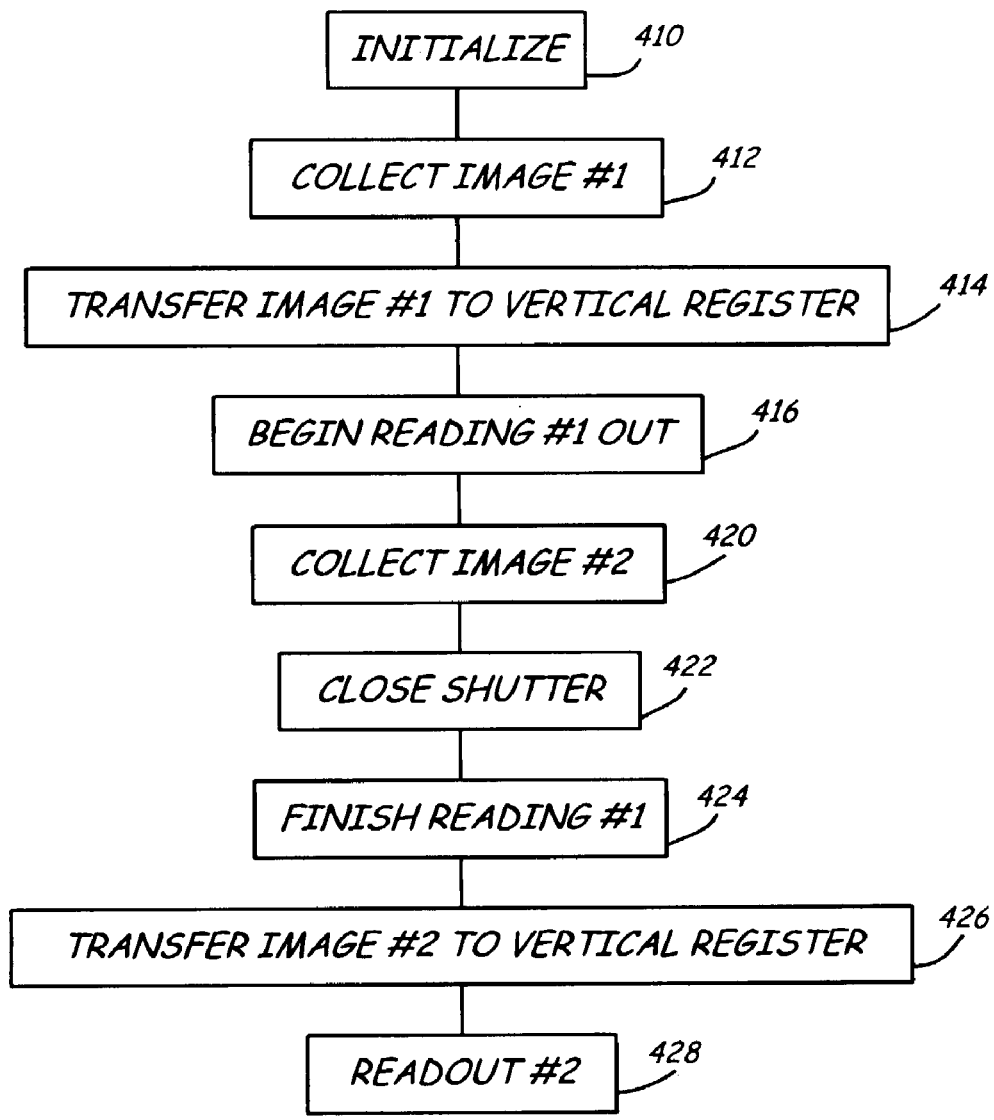
FIG. 10 is a flow diagram of a method of acquiring multiple images using an interline transfer CCD array in accordance with an embodiment of the present invention.

Operation of IT CCD 390 generally occurs in the following sequence. First the image area is reset to clear its photosites of any residual charge as indicated at block 410 in FIG. 10. Once the reset is released, the photosites begin to accumulate charge in response to light as indicated at block 412. After an appropriate exposure time to light, the accumulated charge in the entire image section of the array is transferred to the storage section of the array in a few clock cycles as indicated at block 414. Once the image is in the storage section it is protected from corruption by light, and the next image can be exposed. Since the transfer of the first frame into the storage sites occurs in a few clock cycles, the time delay between each frame acquisition is can be less than 100 μsec. Each line of the first image in the storage section is then transferred to the horizontal register 396 where each pixel shifted out one (or possibly a few, for multi-tap devices) at a time and digitized as indicated at block 416. Once the first image is clocked out, the second image can be clocked out.

Inherently, the frame rate of the CCD increases as the number of lines in the image decreases. With the image geometry shown in FIG. 7, the aspect ratio of the image is elongated in the direction of the tilt. Since the full image is not required in this direction, the resolution (i.e. the number of lines) in this direction can be reduced. Image line resolution reduction can be accomplished by transferring any unwanted lines in the storage section of the CCD to the horizontal register 396 and not shifting them out. Once all unwanted lines have been clocked into horizontal register 396, horizontal register 396 is then shifted its entire length to clear it of any residual charge before the first desired image line is transferred into the horizontal register 396 from storage section 394. Frame time therefore decreases by an amount equal to the number of unwanted lines multiplied by the time it takes to shift a line out of the horizontal register.

Another common type of CCD device is the frame transfer CCD array. This type can also be employed in accordance with embodiments of the present invention. Operation of such a device (illustrated in FIG. 11) generally occurs in the following sequence. First, image area 452 is reset to clear it of residual accumulated charge. Once the reset is released, the photosites comprising image area 452 begin to accumulate charge in response to light. After an appropriate exposure time, the accumulated charge in every pixel is shifted in the vertical direction, one line at a time, into storage area 454. It is not necessary to shift all the lines from the image area to the storage area, but the first line to be shifted must be the bottom-most one. Also, it is important to note that the photosites containing the as yet unshielded portion of the image continue to be exposed to incident light and are therefore subject to corruption, in this case vertical smearing, by such light. Therefore FT devices are most often used in circumstances where there is some external means of controlling when and whether light reaches the detector.

An image in storage area 454 is available for readout much as in the IT CCD configuration. However, a key difference is that as each line of the stored image is shifted vertically to load the horizontal readout register(s) 456 the photosensitive section of the device is shifted vertically as well. This means that the readout of a stored image cannot occur while the photosensitive region of the device is being exposed to an image that is to be preserved for later readout. Further details regarding the high speed acquisition of multiple images on a frame transfer CCD array can be found in co-pending U.S. patent application Ser. No. 09/522,519, filed Mar. 10, 2000, entitled "INSPECTION SYSTEM WITH VIBRATION RESISTANT VIDEO CAPTURE".

As described above, it is not necessary to utilize the full image resolution along the one axis of the image. Therefore, the number of lines required to cover the placement area is less than the number of columns in the image array. By appropriate orientation of the array, only the rows that represent the placement location need to be transferred into the storage area further reducing the time required between image acquisitions. It is possible to take multiple images in a time interval less than the normal specified frame period with known CCD devices. Such image acquisition is facilitated when used with a method to control the light falling on the device after the first image has been exposed.

To prevent corruption of the second image, it is necessary to ensure that only negligible levels of light reach the CCD while the second image waits in the photo-sensitive region for the first image to be read out from the storage region. In this scenario, the second image's exposure can begin any time, including a very short time, after the first image has been transferred into the storage region.

One way to address this concern is to use an electronically controlled optical shutter to control light falling on the CCD array. Electronically controlled optical shutters include, but are not limited to, liquid crystal light valves, micro channel spatial light modulators, and electro-optical light switches.

Figure 9:
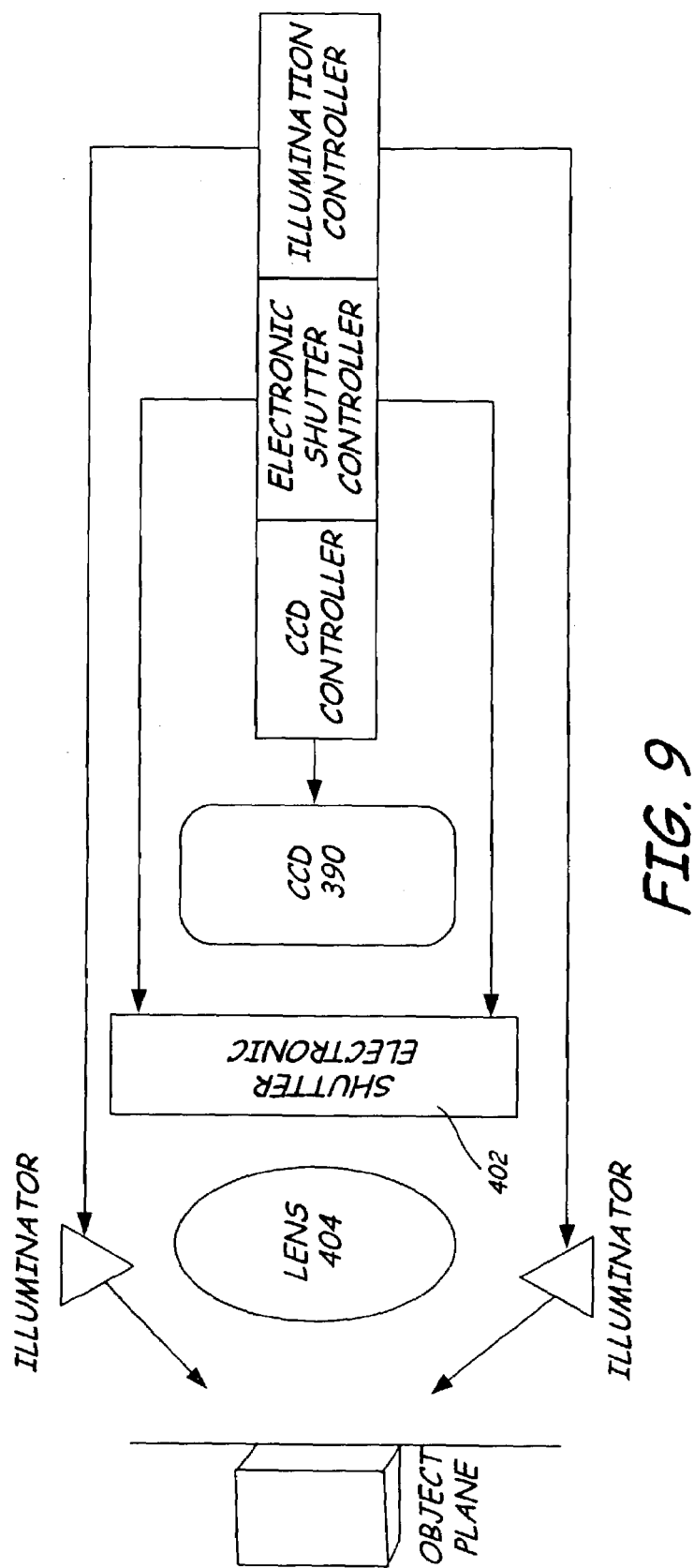
FIG. 9 is a diagrammatic view of an image acquisition system employing an electronic shutter in accordance with an embodiment of the present invention.

FIG. 9 illustrates one such electronic shutter 402 disposed between IT CCD array 390 and lens 404. Operation of the system illustrated in FIG. 9 is described with respect to the flow diagram shown in FIG. 10.

At step 410, when the system is initialized, a control signal is also sent to the electronic shutter to open the shutter, thereby allowing light to pass through, as well as sending a signal to reset the photosites of CCD 390. After the first image has been transferred to the storage section of array 390, as indicated at block 414, the photosensitive pixels are then ready to begin acquiring a new image. After a suitable integration period has elapsed, a signal is sent to electronic shutter 402 causing shutter 402 to close and prevent light from passing through, as indicated at block 422. At block 424, the reading of the first image from array 390 finishes and control passes to block 426 where the second image is transferred from photosites 392 to storage arrays 394. Finally, at step 428, the second image is read from the array 400.

Also, it is possible to acquire two full-resolution (all lines) images in rapid succession using electronic shuttering with a FT CCD array. This is done by resetting the region 452, exposing it to the first image, blocking additional light from falling on the photosensitive region 452, shifting the resulting image line-by-line as fast as possible, limited only by the vertical transfer cycle speed of the device, into storage area 454, preferably resetting the photo-sensitive region 452 again, exposing it to the second image, again blocking additional light from falling on it and then reading out, pixel-by-pixel and line-by-line both images.

It can be seen that this approach can be extended to allow rapid acquisition of more than two images, but to do so requires that each image have fewer than 100% of the available lines. For example, to acquire three images of the same size in rapid succession, the image is limited to only one half of the full image size.

Additional solutions for controlling the exposure of CCDs include controlling the illumination and optical environment of the imaging system itself. One method to control the optical environment is to minimize the effect of ambient light by controlling the wavelength of the illuminator to ensure that it is within a narrow wavelength range and placing a filter in front of the CCD designed to reject light that is not within the band of the illuminator's wavelength. When systems in accordance with this embodiment are employed, the camera should be placed within an environment that does not include ambient light falling within the wavelength of the bandpass filter. Then, the photosites within the array are only sensitive to the external illuminators that are controlled by the camera and flashed in synchronism with the exposure of the CCD.

Another method of controlling ambient light without controlling the wavelength of the illuminator is to provide a stop of sufficiently small size, or a neutral-density filter placed in the optical train such that ambient light is reduced to a relatively insignificant level. With the ambient light reduced, the illuminators are strobed at the appropriate times and durations to provide enough light to expose the photosites even in the presence of the small stop or neutral density filter.

Figure 12:
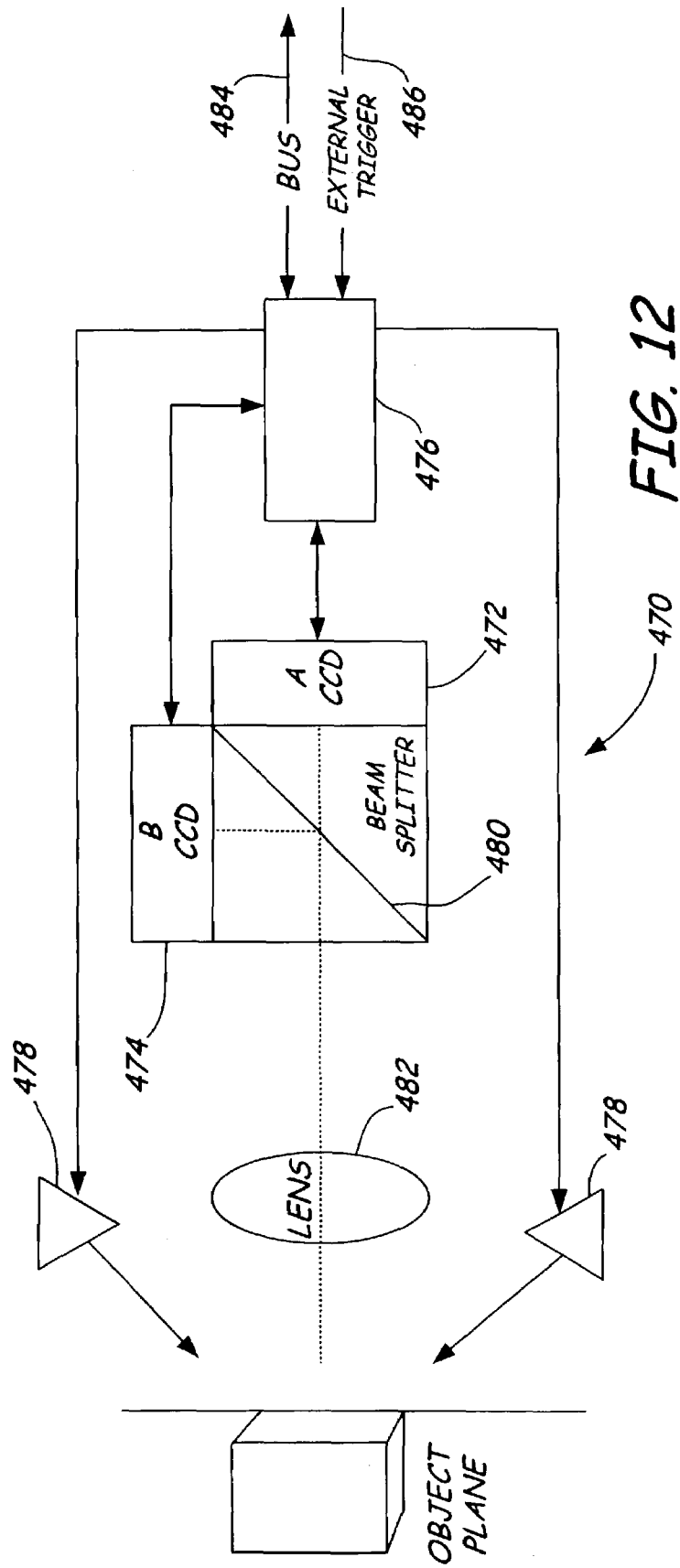
FIG. 12 is a diagrammatic view of an image acquisition system employing a plurality of CCD arrays and a common optical train through a beamsplitter in accordance with an embodiment of the present invention.

FIG. 12 illustrates an alternate arrangement that can be used for either or both of devices 300, 302 to acquire a plurality of images at an interval that would otherwise exceed the frame rate of a commercially available CCD camera. Specifically, system 470 includes a pair of CCD arrays 472, 474 that are coupled to electronics 476, which electronics 476 also control illuminators 478. Both of CCD arrays 472 and 474 are part of an optical train which, using beam splitter 480, allows both CCD arrays 472, 474 to view the object plane through lens 482. While similar structures are used in today's modern color CCD cameras, which typically include three different CCD arrays, where each array receives light of a different band of wavelengths, such devices are not believed to have been used to obtain a plurality of substantially monochromatic views very close in time to one another but not simultaneous with one another. Instead of each CCD array taking an image simultaneously (as in the case of color CCD cameras) each CCD array can be triggered sequentially to capture an image, before, after or anytime during placement of an object in the field of view. As illustrated, electronics 476 is coupled to a high speed data bus 484, as well as a source of trigger information 486 which preferably includes suitable position encoders. Note, aspects of this embodiment can be combined with the high speed image acquisition described above such that each CCD array operates to acquire images at a rate faster than can be read from each array effectively capturing more than two images in rapid sequence.

While the system described with respect to FIG. 2 showed a pair of cameras used for stereovision imaging, additional cameras and illumination systems can be used for added benefits. Accordingly, one aspect of the present invention includes using multiple, complementary views of an inspection target with both overlapping and non-overlapping areas of the views.

Multiple views can provide complete coverage of a target. The non-overlapping area of any view fills in information that is absent from all of the other views. This is particularly important for inspection applications where the views are typically not from directly overhead, since oblique views are subject to partial obscurations.

Multiple, distinct views of the same target can be used to generate unique information not derivable from any single image alone. (1) The overlapping portions of the views provide redundant data to improve the recognition of features in the common area. (2) The overlapping areas can be used directly or through some kind of specialized preparation (e.g. structured illumination) to derive unique information such as height.

Multiple images can be provided by:
1) Entirely separate illumination, optics, and detectors;
2) Entirely separate optics and detectors with common illumination; or
3) Separate detectors with common optics and illumination.

The simplest configuration consists of multiple identical complete 'cameras' (detector, optics, illumination) with substantial overlap in their fields of view as well as complete coverage of the intended target from all sides.

Figure 13:
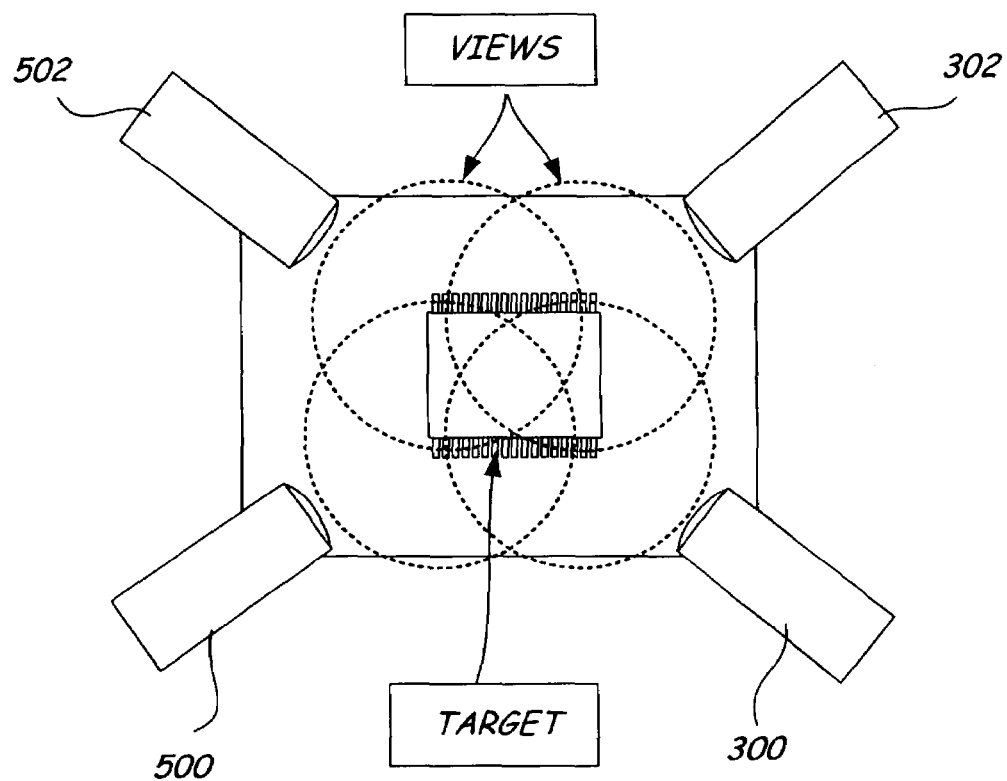
FIG. 13 is a diagrammatic top view of multiple image acquisition systems being employed to generate multiple views of a placement location, in accordance with an embodiment of the present invention.

FIG. 13 is a diagrammatic view of a four camera configuration seen from above. Cameras 300, 302, 500, 502 capture images and may also provide illumination. Note that a small part of each corner of the target is seen in only one of the four views. There are also substantial regions of overlap between pairs of views.

Using multiple views to improve recognition provides a number of benefits. Rather than resorting to complex optics to cover the desired target in a single view, this method uses a small number of relatively simple cameras working together. Not only is coverage complete, but additional information is available from the redundant, overlap parts of the different camera views. This is not available from a single camera. There is also some redundancy provided and added reliability since with multiple views, occluded regions in one image can be remedied or otherwise replaced with similar portions with other images.

Figure 14:
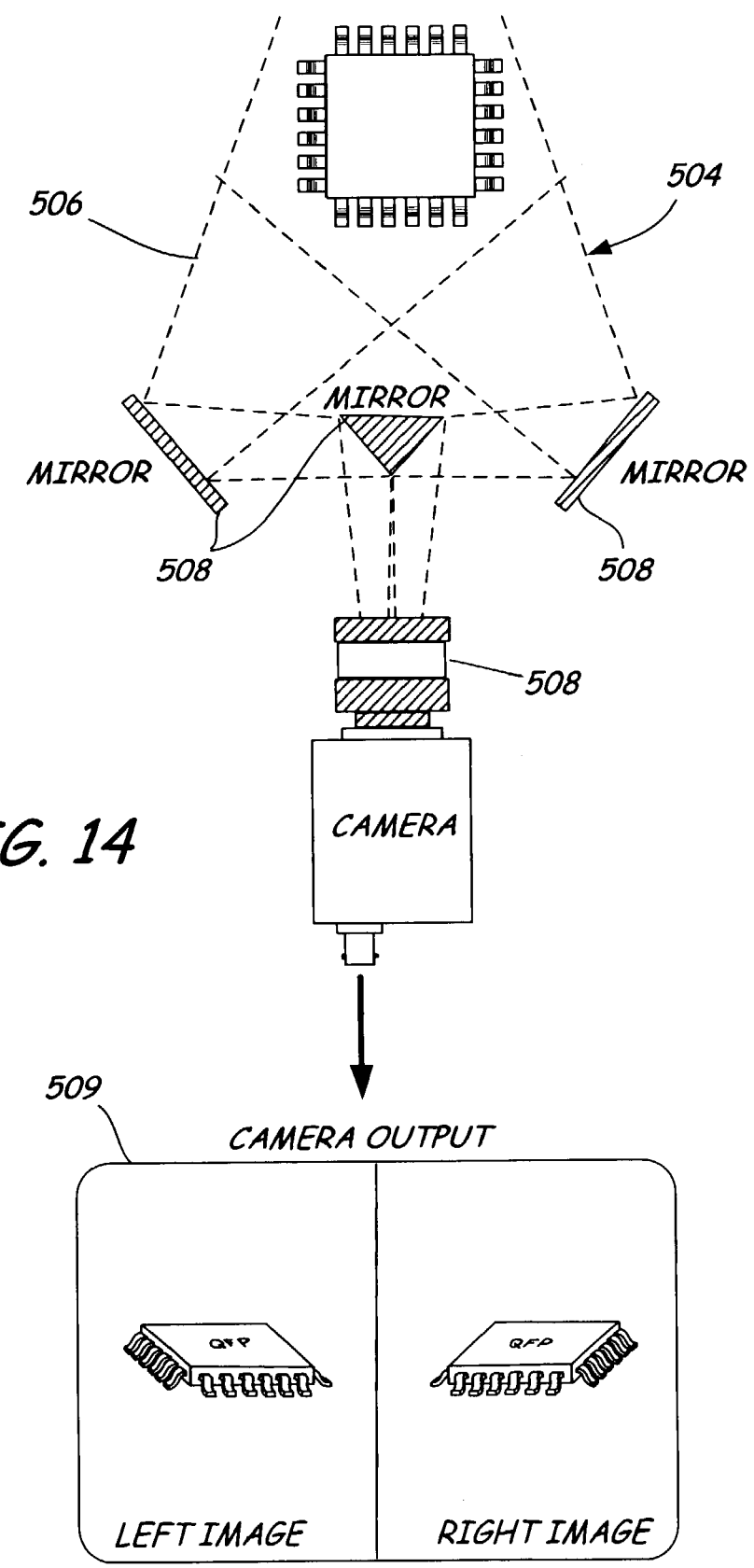
FIG. 14 is a diagrammatic view of a multiple optical path imaging system.

Using suitable optics, a single detector can also be used to gather multiple views by using an imaging system having multiple optical paths. FIG. 14 is a diagrammatic view of such an imaging system. Each separate view 504, 506 is directed by appropriate optics 508 to a subset of the detector surface. Thus, the image acquired by the detector will contain both views as illustrated at 509. This could be particularly useful if the detector is extremely expensive or if the space constraints require that the views be delivered by fiberoptics or other means to a remote detector.

Image Processing

As described above, verifying the placement of a component on a printed circuit board can be done by acquiring before-placement and after-placement images of a location on the circuit board where the component is expected to be placed, and then subtracting one image from the other. The part of the image that does not change between the before and after pictures is thereby suppressed and artifacts of the newly placed component are clearly present in the resulting image. The before-placement and after-placement images are not generally perfectly aligned, however, due to mechanical vibration, inaccurate mechanical motion, or because the printed circuit board and/or cameras are in motion when the images are acquired. When the two images (before and after) are not aligned, artifacts appear in the resulting differenced image which may be a false indicator that the component is present. One technique to estimate the misalignment of the two images is using correlation (e.g. normalized gray-scale correlation). However, correlation only works if orthogonal edges are present in the template (area of the image being correlated). If no edges are present or edges in only one direction are present, the correlation will not produce a unique (x, y) location for alignment.

Vision systems, such as that used in accordance with embodiments of the present invention, may be able to pick good locations for templates if CAD data were available and the vision system knew where on the board it was looking relative to the CAD description. Alternatively, if the vision system could be taught off-line by being shown every possible field of view, the vision system could pre-determine good locations or templates. However, if neither of these conditions is true, then the vision system needs to quickly determine good template locations during run-time.

Figure 15:
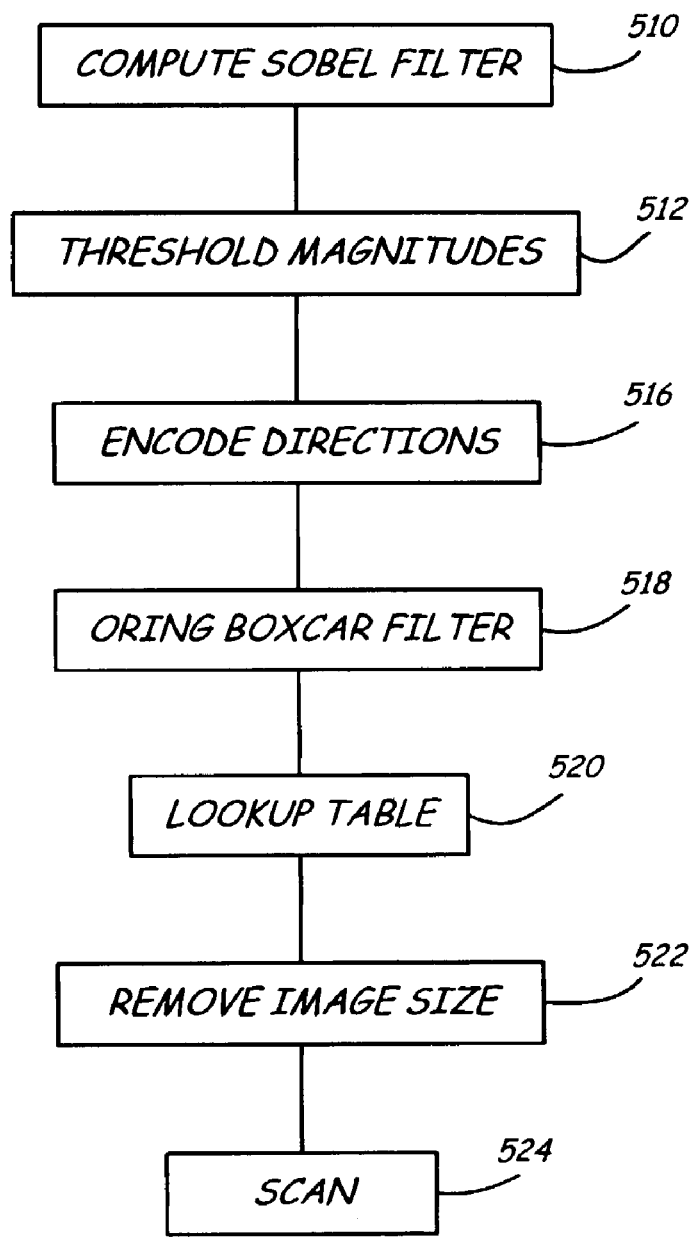
FIG. 15 is flow diagram of a method of identifying locations within acquired images that facilitate image comparisons in accordance with embodiments of the present invention.

One aspect of embodiments of the present invention provides an efficient computational method for determining good locations in one image for selecting a template for correlation in another image. The method is illustrated in FIG. 15 and begins at block 510 where a Sobel edge filter is computed on the before-placement image, computing both the magnitude and direction of the strongest edge around every pixel. (Alternatively, a simpler gradient operation could be used in a 3×3 neighborhood around every pixel). At block 512, the edge magnitudes are thresholded and the edge directions are rounded to one of eight degrees: 0, 45, 90, 135, 180, 225, 270 and 315 degrees.

Figure 16:
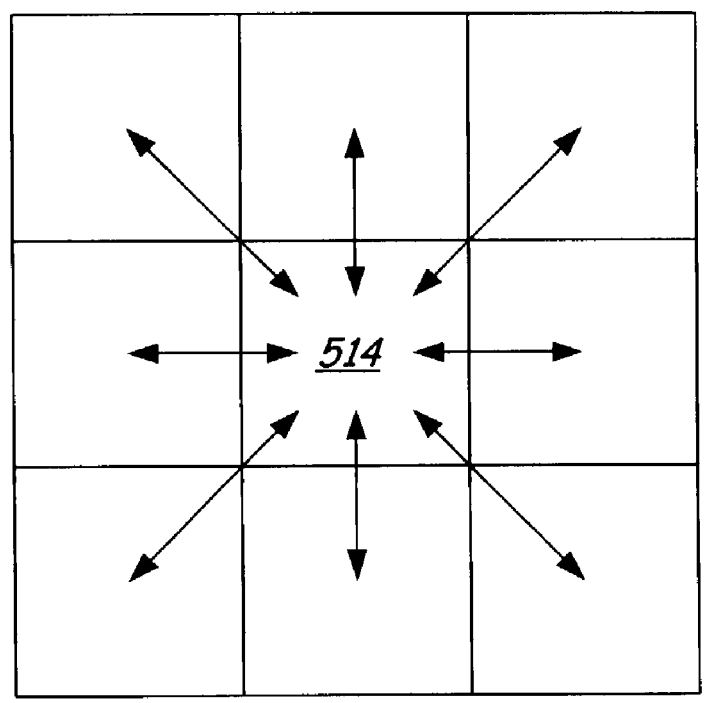
FIG. 16 is a diagrammatic view of a pixel and its surrounding neighbors.

FIG. 16 illustrates a pixel 514 and its eight neighbors. Each arrow indicates a normal edge direction. At block 516, the eight directions are encoded for each pixel into an eight-bit byte (edge-encoded pixel). The eight directions listed in this step can be described by their compass directions as follows: east—7, northeast—6, north—5, northwest—4, west—3, southwest—2, south—1 and southeast—0. At block 518, an OR' ing boxcar filter is performed on the encoded data. Unlike a normal boxcar filter, which computes an average like a low-pass filter, this OR' ing boxcar filter performs a bit-wise OR operation on the pixels within the aperture neighborhood. The aperture may be 5×5 pixels or 7×7 pixels (or some other size as appropriate). In the resulting "image" of edge-encoded pixels, each pixel indicates which edge directions are present in its 5×5 or 7×7 neighborhood. At block 520, a predefined look-up table is used to assign scores to every eight-bit edge-encoded pixel in the image. Only a small number of scores (e.g., 4) are generally needed. Since eight-bit codes index into the look-up table, the look-up table need only be $2^8$ or 256 elements. The higher the score, the better the 5×5 or 7×7 neighborhood represented is for use in a correlation template. Of the 256 8-bit edge encodings, the vast majority are symmetrical, so only a few sample scores are shown in the following table.

TABLE 1

| Score | Sample 8-bit codes |
|---|---|
| 0 | ( ), (E), (E,W), (E,SE), (E,NW,W,SE) |
| 1 | (E,NE,SE), (E,NE,NW,W,SW,SE), (E,NE,W,SE) |
| 2 | (E,NE,S,SE), (E,W,SW,S,SE), (E,NW,W,SW,S,SE) |
| 3 | (E,NE,N,NW,W,SW,S,SE), (E,N,NW,W,SW,S,SE), (E,N,W,S), (E,NE,N,W,S) |

At block 522, the size of the image is reduced by summing 4×4 neighborhoods of scores. (In other words, a pyramid image is built). Alternatively, an additive boxcar filter can be applied on the image with a 4×4 or larger aperture size. Finally, at block 524, the resulting image of scores is scanned for high scores. The high scores indicate good locations in the original image that can be used as correlation templates. Since the component will be placed somewhere in the central part of the image, the search for high scores should be restricted to be outside of the central part of the image. (In fact, all of the above processing can avoid the central area of the image for the sake of efficiency.)

Figure 17:
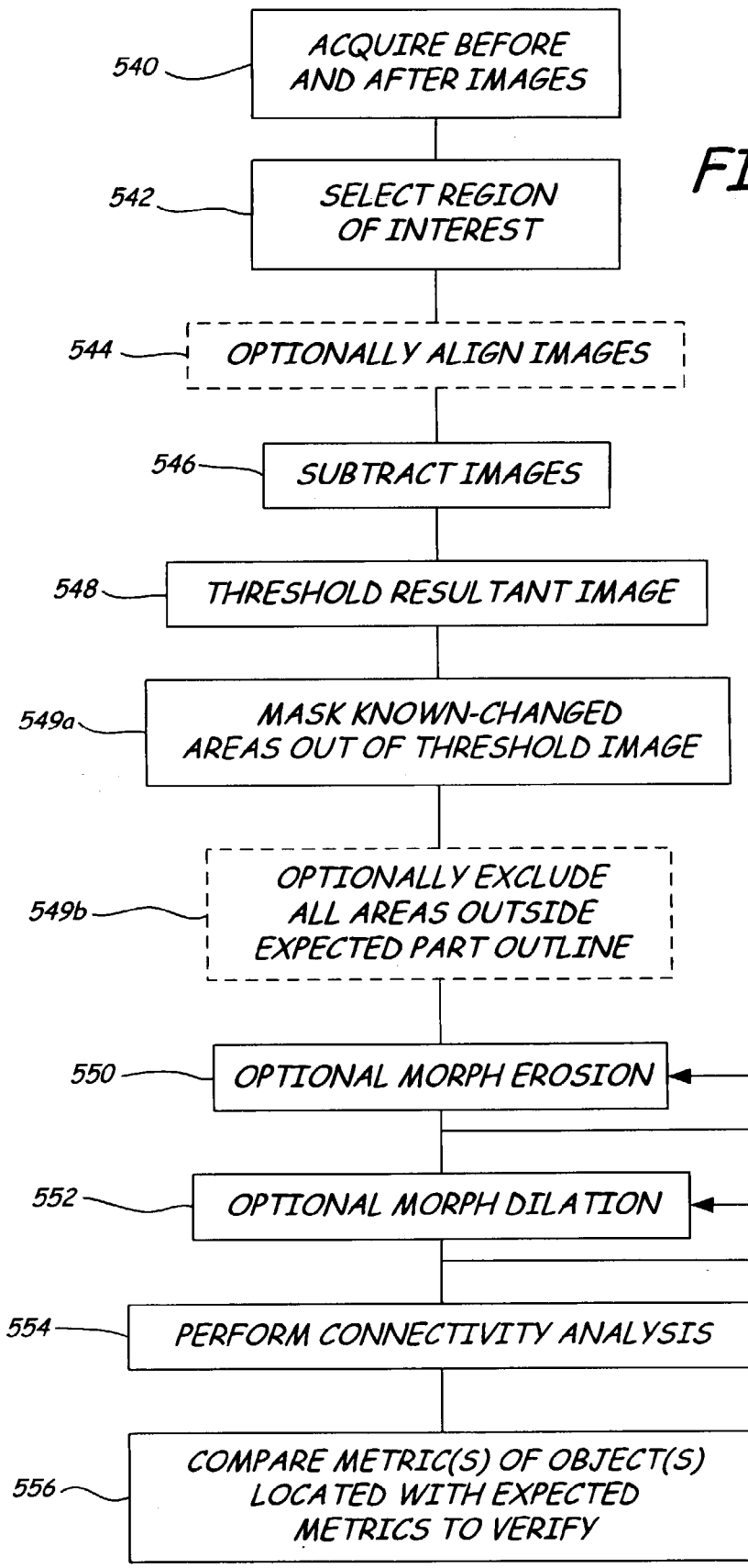
FIG. 17 is a diagrammatic view of a method for analyzing images to provide component placement verification in accordance with an embodiment of the present invention.
Figure 23A:
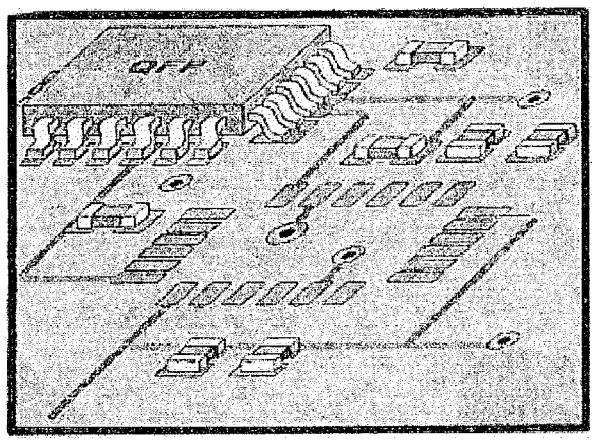
FIGS. 23A–23G are exemplary images used and/or produced in accordance with embodiments of the present invention.
Figure 23B:
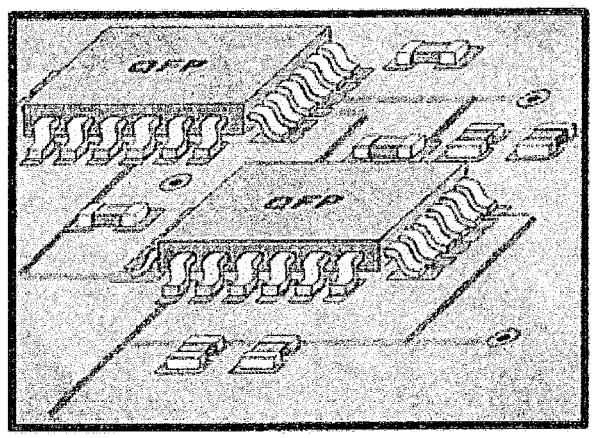
Figure 23C:
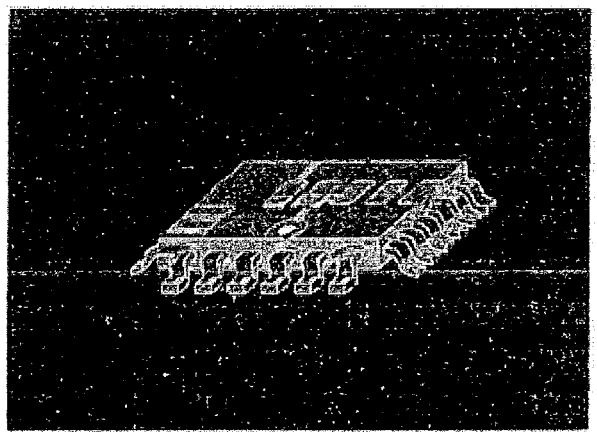
Figure 23D:
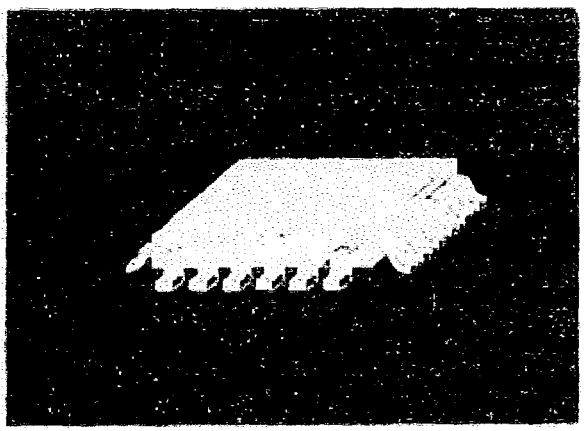

FIG. 17 illustrates a method of analyzing acquired images to determine component absence/presence, block 336, in accordance with an embodiment of the present invention. At block 540, both before and after images are acquired. Examples of before placement and after placement images are provided as FIGS. 23A and 23B, respectively. Dashed block 544 indicates an optional step of aligning the two images using one-dimensional or two-dimensional correlation. Preferably, the alignment method described above with respect to FIGS. 15 and 16 is employed. At block 546, the aligned before and after images are subtracted from one another. Every pixel is given its absolute value. This step highlights changes in the image, and hence highlights the difference between the two images. An exemplary difference image is illustrated in FIG. 23C. At block 548, the differenced image is thresholded, providing an image that may resemble that shown in FIG. 23D. Thresholding the differenced image creates a binary image that distinguishes areas of change from areas of no change.

In block 549*a*, areas known to always change between the two images, such as the nozzle and reflections of the nozzle, are masked out of the thresholded image. This masking is accomplished by drawing filled black polygons in an otherwise white mask image over the regions known to change. The known-changed mask image is then ANDed with the thresholded image. Optionally, if component data including the length, width, and height of the component are available, in block 549*b*, the system generates a white mask covering the two-dimensional projection at the image plane of the volume expected to be occupied by the part in an otherwise black image. This masking is accomplished by drawing a white filled polygon in an otherwise black mask image over the region where the part will be placed. The expected part mask image is then ANDed with the thresholded image.

Figure 23E:
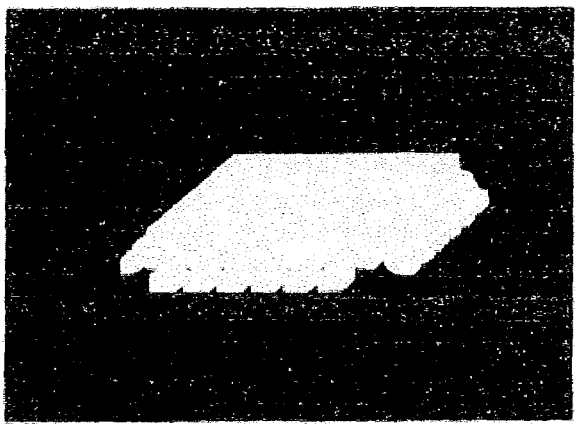

At block 550, optional morphological erosion operations can be performed one or more times, as indicated by the loop marked "N". This erosion is useful for removing small objects that are the result noise or image misalignment. At block 552, another optional morphological operation is provided. Specifically, block 552 provides an optional dilation operation that can be performed one or more times, as indicated by the loop marked "M". The dilation operations facilitate merging portions of a single object that may have been separated by the erosion operation or by features of the component which matched the background image. An example image after such dilation is provided in FIG. 23E. At block 554, connectivity analysis is performed to find objects in the image. This analysis generates many useful metrics on each of the objects in the image, such as object centroid, length, width, area, rotation etc. (Gleason, et al., "A Modular Vision System for Sensor-Controlled Manipulation and Inspection", Proc. $9^{th}$ Symposium on Industrial Robots, March 1979, pp. 57–570.) Finally, at block 556, the component placement is verified by comparing the metrics of the objects found in the images with expected object metrics. This comparison may include, but is not limited to, such metrics as centroid location, width, area, rotation, etc.

Figure 18:
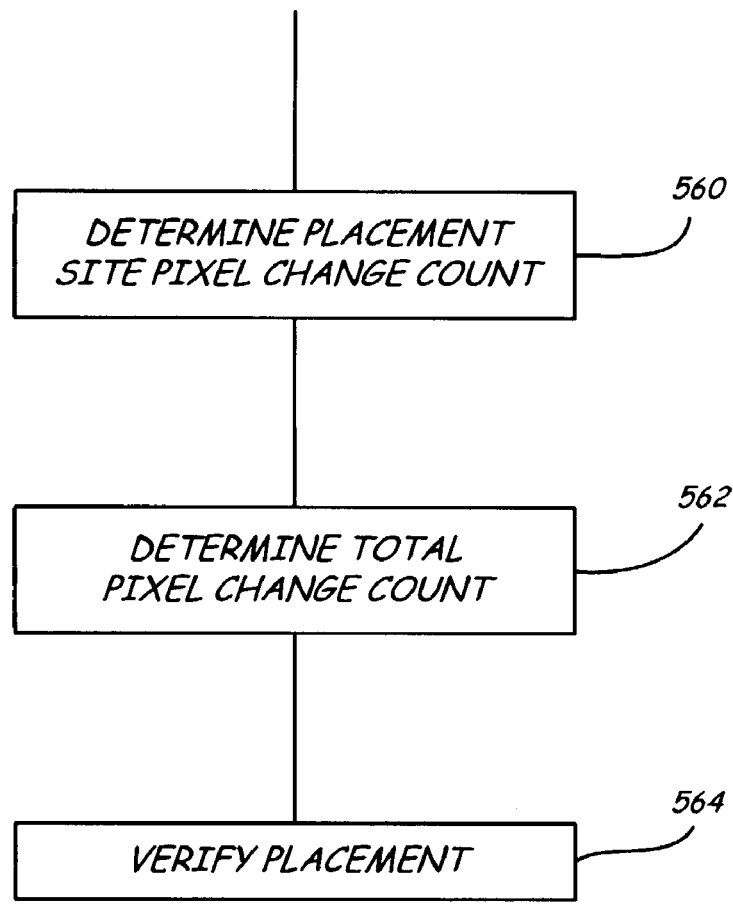
FIG. 18 is a diagrammatic view of another method for analyzing images to provide component placement verification in accordance with an embodiment of the present invention.

FIG. 18 is a diagrammatic view of another method for analyzing images to determine component absence/presence in accordance with an embodiment of the present invention. The method illustrated in FIG. 18 also includes steps 540, 542, 544 and 546 described with respect to FIG. 17. Accordingly, those steps are neither described nor shown in FIG. 18, which begins with step 560 that executes after step 546. At block 560, the pixel change count of the placement site is determined. This is accomplished by counting pixels whose value is above some threshold and also within a region of the image where the component is expected to be placed. At block 562, the total pixel count is determined by counting pixels whose value is above some threshold and not in the region of the image where the component is expected to be placed. At block 564, component placement verification is performed by comparing the Placement Site pixel change count (Block 560) with the Total pixel change count (Block 562).

Figure 19:
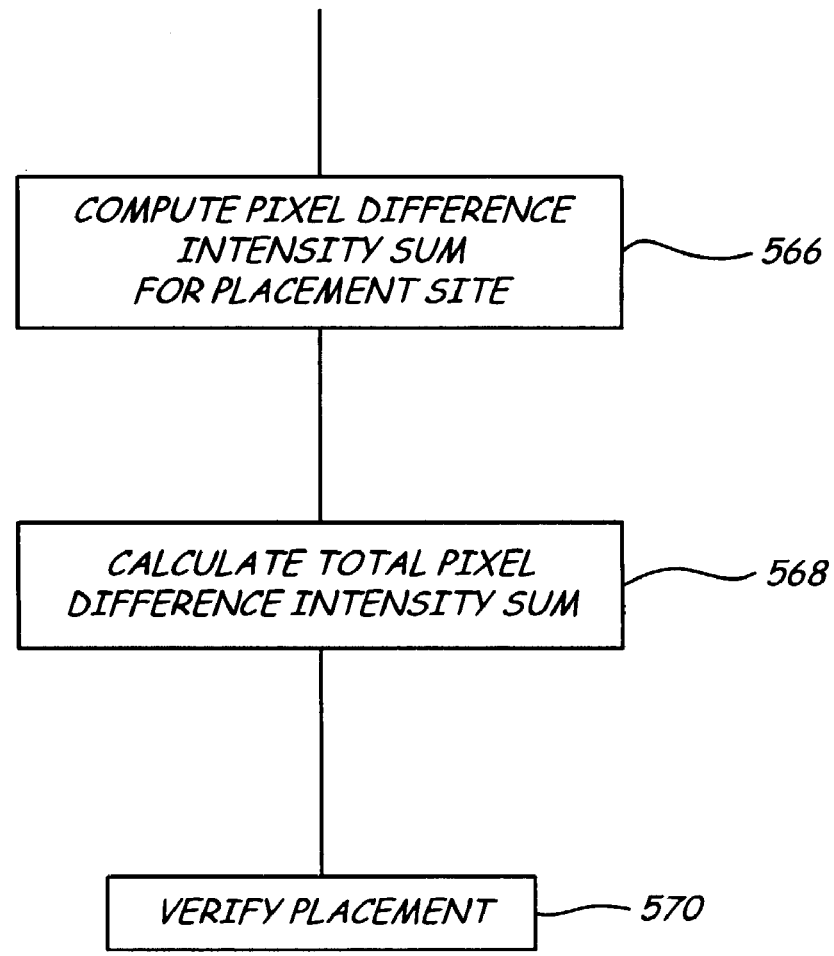
FIG. 19 is a diagrammatic view of yet another method for analyzing images to provide component placement verification in accordance with an embodiment of the present invention.

FIG. 19 is a diagrammatic view of yet another method for analyzing images to determine component absence/presence, block 336, in accordance with an embodiment of the present invention. The method illustrated in FIG. 19 also includes steps 540, 542, 544, and 546, described with respect to FIG. 17. Accordingly, those steps are neither described nor shown in FIG. 19, which begins with block 566 that executes after step 546. At block 566, the Placement Site Pixel Difference Intensity Sum is calculated for the placement site by summing pixels whose value is above a threshold and also in a region of the image where a component is expected. At block 568, the Total Pixel Difference Intensity sum is calculated by taking the sum of pixel intensity values in the entire difference image. At block 570, component placement is verified by comparing the Placement Site Pixel Difference Intensity Sum to the Total Pixel Difference Intensity Sum.

Figure 20:
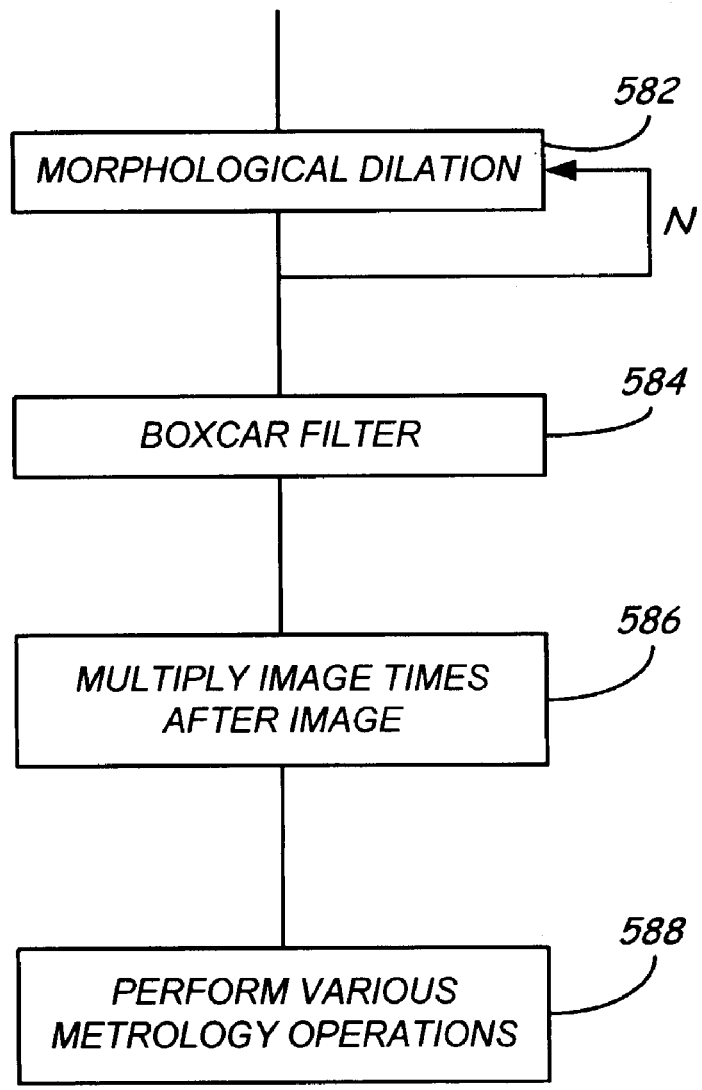
FIG. 20 is a diagrammatic view of a method for analyzing images for value/type verification, X, Y, θ positional registration measurement and polarity determination in accordance with an embodiment of the present invention.

FIG. 20 is a diagrammatic view of a method for analyzing images for "Value/type verification" [block 344 in FIG. 4], "X, Y, theta registration measurement" [block 346 in FIG. 4], and "Polarity determination" [block 348 in FIG. 4]. The method illustrated in FIG. 20 includes steps 540, 542, 544, 546, 548, 549*a* and 549*b* described with respect to FIG. 17. Accordingly, those steps are neither described nor shown in FIG. 20, which begins with step 582 that executes after step 549*b*.

Figure 23F:
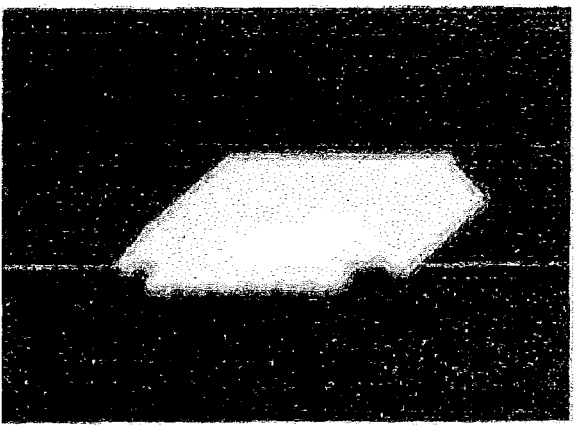
Figure 23G:
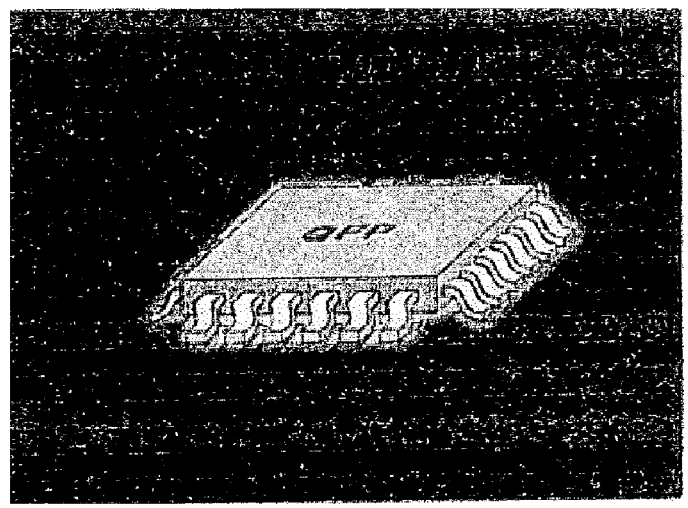

The sequence of steps 544 to 549*b* and 582 to 584 produces a mask image. Steps 544 to 549*b* were described above. Step 582 performs multiple (e.g., five) 3×3 binary dilations on the thresholded difference image. Step 584 is a large boxcar filter (typically 19×19 pixels) to blur the dilated difference image, generating an image that may resemble FIG. 23F. In step 586, the blurred mask image produced by step 584 is multiplied times the "after image" acquired in step 540. This isolates the placed component in the image, erasing the non-changing parts of the image. Multiplying the blurred mask times the after image is better than simply ANDing the non-blurred mask image with the after image because ANDing the mask with the gray-scale image would produce artificial edges along the perimeter of the mask. An exemplary image resulting from such multiplication is provided in FIG. 23G.

Step 588 places various image metrology tools such as line fitters and "rulers" or "calipers" to locate the leads of components or, in the case of BGAs where the leads (actually balls) are hidden under the part, the four sides of the component. After the leads and/or sides of the component have been located, the X, Y, theta position of the component can be computed.

Similarly, Optical Character Recognition (OCR) or correlation can be used on the image produced at block 586 for "Value/type verification". Additional metrology tools can also be applied to the same image to determine polarity.

Although the present invention has been described with reference to preferred embodiments, workers skilled in the art will recognize that changes may be made in form and detail without departing from the spirit and scope of the invention.

What is claimed is:

1. A pick and place machine for placing a component upon a workpiece, the machine comprising:
   a placement head having at least one nozzle for releasably holding the component;
   a robotic system for generating relative movement between the placement head and the workpiece;
   a first image acquisition device disposed to obtain a first view before-image of an intended placement location before placement of the component, and a first view after-image of the intended placement location after placement of the component;
   a second image acquisition device disposed to obtain a second view before-image of an intended placement location before placement of the component, and a second view after-image of the intended placement location after placement of the component;
   wherein the first and second views are spaced apart to provide stereovision inspection of the intended placement location; and
   wherein the first image acquisition device includes a CCD array having a frame rate, and wherein the first image acquisition device causes the CCD array to acquire the first view before image and the first view after image at a rate that exceeds the readout rate of the CCD array.

2. The machine of claim 1, wherein:
   the first view is disposed at an angle relative to a plane of the intended placement location; and
   a detector array within the first image acquisition device is disposed at an angle relative to an optical axis of the first image acquisition system.

3. The machine of claim 1, and further comprising:
   an illuminator including a light source mounted remote from the nozzle; and a light pipe optically coupled to the light source and having an output end directed to illuminate the intended placement location.

4. The machine of claim 3, wherein the illuminator provides light having a band of wavelengths, and wherein the at least the first image acquisition system includes a filter to pass light within the band and obstruct light outside the band.

5. The machine of claim 1, wherein the first image acquisition system employs non-telecentric optics.

6. The machine of claim 1, and further comprising a structured illuminator adapted to direct structured illumination upon the intended placement location, and wherein at least one of the first and second image acquisition devices obtains a structured illumination image of the intended placement location after component placement.

7. The machine of claim 1, wherein the CCD array is an interline transfer CCD array.

8. The machine of claim 1, wherein the CCD array is a frame transfer CCD array.

9. The machine of claim 1, wherein the first image acquisition device further includes an electronically controlled optical shutter device to obstruct excess light after the first view after image integration time has elapsed.

10. The machine of claim 1, and further comprising a structured illuminator adapted to direct structured illumination upon the intended placement location, and wherein at least one of the first and second image acquisition devices obtains a structured illumination image of the intended placement location before component placement.

11. The device of claim 1, wherein inspection of the intended placement location includes pre-placement inspection of the intended placement location.

* * * * *